United States Patent
Wang et al.

(10) Patent No.: US 12,295,193 B2
(45) Date of Patent: May 6, 2025

(54) DISPLAY SUBSTRATE AND DISPLAY DEVICE

(71) Applicant: BOE TECHNOLOGY GROUP CO., LTD., Beijing (CN)

(72) Inventors: Can Wang, Beijing (CN); Wei Li, Beijing (CN); Lijun Yuan, Beijing (CN); Jingjing Zhang, Beijing (CN); Can Zhang, Beijing (CN); Jinfei Niu, Beijing (CN); Ning Cong, Beijing (CN); Minghua Xuan, Beijing (CN); Xiaochuan Chen, Beijing (CN); Xue Dong, Beijing (CN); Qi Qi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 448 days.

(21) Appl. No.: 17/634,287

(22) PCT Filed: Mar. 11, 2021

(86) PCT No.: PCT/CN2021/080292
§ 371 (c)(1),
(2) Date: Feb. 10, 2022

(87) PCT Pub. No.: WO2022/188107
PCT Pub. Date: Sep. 15, 2022

(65) Prior Publication Data
US 2023/0163157 A1    May 25, 2023

(51) Int. Cl.
*H01L 27/15*     (2006.01)
*H10H 29/14*    (2025.01)

(52) U.S. Cl.
CPC .......... *H10H 29/14* (2025.01); *H10H 29/142* (2025.01)

(58) Field of Classification Search
CPC ..... H01L 33/20; H01L 33/486; H01L 33/504; H01L 33/58; H01L 33/62; H01L 33/50;
(Continued)

(56) References Cited

U.S. PATENT DOCUMENTS

| 2015/0221870 A1 | 8/2015 | Shintani et al. |
| 2016/0063911 A1 | 3/2016 | Wu et al. |

(Continued)

FOREIGN PATENT DOCUMENTS

| CN | 102165611 A | 8/2011 |
| CN | 104835832 A | 8/2015 |

(Continued)

OTHER PUBLICATIONS

Chinese Office Action issued in Chinese Application No. 202180000455.1 on Mar. 4, 2025.

*Primary Examiner* — Marlon T Fletcher
*Assistant Examiner* — Christina A Sylvia
(74) *Attorney, Agent, or Firm* — Dilworth & Barrese, LLP.; Michael J. Musella, Esq.

(57) ABSTRACT

A display substrate and a display device are provided. The display substrate includes light emitting diode chips, each light emitting diode chip includes light emitting units which respectively emit light of different colors, each light emitting unit includes a first electrode, a light emitting layer, a base and a second electrode, and the base and the second electrode are respectively located at both sides of the light emitting layer. In each light emitting diode chip, the light emitting units share the base and the first electrode, the light emitting layers of the light emitting units emit light of the same color, and at least one light emitting unit further includes a first color conversion layer located at a side of the (Continued)

base away from the light emitting layer, so as to convert first color light emitted by the light emitting layer into second color light.

19 Claims, 10 Drawing Sheets

(58) Field of Classification Search
CPC .. H01L 25/0753; H01L 27/156; H01L 27/153
See application file for complete search history.

(56) References Cited

U.S. PATENT DOCUMENTS

| | | | |
|---|---|---|---|
| 2017/0358624 A1* | 12/2017 | Takeya | H01L 33/42 |
| 2019/0189679 A1 | 6/2019 | Kawk et al. | |
| 2021/0118944 A1* | 4/2021 | Han | H01L 27/156 |
| 2021/0143230 A1 | 5/2021 | Wang et al. | |

FOREIGN PATENT DOCUMENTS

| | | | |
|---|---|---|---|
| CN | 107195653 A | 9/2017 | |
| CN | 108878626 A | 11/2018 | |
| CN | 109324435 A | 2/2019 | |
| CN | 109979958 A | 7/2019 | |
| CN | 109994585 A | 7/2019 | |
| CN | 110133886 A | 8/2019 | |
| CN | 110224001 A | 9/2019 | |
| CN | 110518033 A | 11/2019 | |
| CN | 110998852 A | 4/2020 | |
| CN | 111261790 A | 6/2020 | |
| CN | 111430403 A | 7/2020 | |
| CN | 112164705 A | 1/2021 | |
| WO | 2008046058 A2 | 4/2008 | |

* cited by examiner

DISPLAY SUBSTRATE AND DISPLAY DEVICE

TECHNICAL FIELD

At least one embodiment of the present disclosure relates to a display substrate and a display device.

BACKGROUND

At present, inorganic light emitting display devices, such as Mini LED or Micro LED, have been more and more widely used. The LED display industry chain involves display backplane, LED elements and solid crystal transfer technology.

SUMMARY

At least one embodiment of the present disclosure provides a display substrate and a display device.

At least one embodiment of the present disclosure provides a display substrate, the display substrate includes a plurality of light emitting diode chips. Each of the plurality of light emitting diode chips includes a plurality of light emitting units which respectively emit light of different colors, each of the plurality of light emitting units includes a first electrode, a light emitting layer, a base and a second electrode, the base is located at a side of the light emitting layer away from the second electrode. In each of the plurality of light emitting diode chips, the plurality of light emitting units share the base and the first electrode, the light emitting layers of the plurality of light emitting units emit light of a same color, and at least one light emitting unit further includes a first color conversion layer located at a side of the base away from the light emitting layer, so as to convert first color light emitted by the light emitting layer into second color light.

For example, in embodiments of the present disclosure, each of the plurality of light emitting units further includes a first contact pad and a second contact pad which are arranged in a same layer, the first contact pad is connected with the first electrode, and the second contact pad is connected with the second electrode; each of the plurality of light emitting diode chips includes a first color light emitting unit, a second color light emitting unit and a third color light emitting unit, the first color light emitting unit is configured to emit the first color light; the second color light emitting unit further includes the first color conversion layer located at a side of the base away from the light emitting layer and the second color light emitting unit emits the second color light, and the third color light emitting unit further includes a second color conversion layer at a side of the base away from the light emitting layer, so as to convert the first color light emitted by the light emitting layer into third color light.

For example, in embodiments of the present disclosure, in each of the plurality of light emitting diode chips, connection lines between geometric centers of a light emitting region of the first color light emitting unit, a light emitting region of the second color light emitting unit and a light emitting region of the third color light emitting unit form a first triangle, and a ratio of shortest distances between edges of the light emitting regions of different color light emitting units is in a range of 0.6 to 1.5.

For example, in embodiments of the present disclosure, the light emitting regions of the plurality of light emitting units in each of the plurality of light emitting diode chips are distributed in a rectangular region, and the light emitting region of the first color light emitting unit, the light emitting region of the second color light emitting unit and the light emitting region of the third color light emitting unit are located at three right angles of the rectangular region, respectively.

For example, in embodiments of the present disclosure, in each of the plurality of light emitting diode chips, the second contact pad of the first color light emitting unit, the second contact pad of the second color light emitting unit and the second contact pad of the third color light emitting unit are respectively distributed at the three right angles of the rectangular region, and the first contact pad is located at a fourth right angle of the rectangular region.

For example, in embodiments of the present disclosure, the first triangle is an acute triangle.

For example, in embodiments of the present disclosure, in each of the plurality of light emitting diode chips, connection lines between geometric centers of the second contact pad of the first color light emitting unit, the second contact pad of the second color light emitting unit and the second contact pad of the third color light emitting unit form a second triangle, and at least part of the first contact pad is located in the second triangle.

For example, in embodiments of the present disclosure, an area of the light emitting region of the second color light emitting unit and an area of the light emitting region of the third color light emitting unit are both greater than an area of the light emitting region of the first color light emitting unit.

For example, in embodiments of the present disclosure, the plurality of light emitting diode chips are arrayed along a first direction and a second direction, and a pitch of the plurality of light emitting diode chips along at least one of the first direction and the second direction is not greater than 400 microns.

For example, in embodiments of the present disclosure, a side of the base away from the light emitting layer is provided with a plurality of grooves.

For example, in embodiments of the present disclosure, a depth of at least one of the plurality of grooves is greater than 10 microns.

For example, in embodiments of the present disclosure, each of the plurality of light emitting units is provided with one groove, and in each of the plurality of light emitting units, the groove overlaps with the light emitting layer, and a light-shielding layer is provided at an inner side wall of at least one groove; the first color conversion layer is disposed in the groove of the second color light emitting unit, and the second color conversion layer is disposed in the groove of the third color light emitting unit.

For example, in embodiments of the present disclosure, a transparent filling layer is disposed in a bottom of the groove of at least one of the second color light emitting unit and the third color light emitting unit.

For example, in embodiments of the present disclosure, a blocking portion is provided at a side, away from the light emitting layer, of a gap between the grooves of adjacent light emitting units, and a material of the blocking portion includes a hydrophobic material.

For example, in embodiments of the present disclosure, at least part of the plurality of grooves are arranged between adjacent light emitting units, and at least an inner side wall of each of the plurality of grooves is provided with a light shielding material.

For example, in embodiments of the present disclosure, a pixel defining portion is provided at a side of the base away from the light emitting layer, the pixel defining portion includes a plurality of openings to define a plurality of light emitting regions of the plurality of light emitting units, the first color conversion layer is disposed in the opening of the second color light emitting unit, and the second color conversion layer is disposed in the opening of the third color light emitting unit.

For example, in embodiments of the present disclosure, at least one groove is fully filled with the light shielding material, and at least part of the pixel defining portion is stacked with the light shielding material.

For example, in embodiments of the present disclosure, in each of the plurality of light emitting diode chips, light emitting regions of the plurality of light emitting units are arranged along a third direction, the second contact pad is located at a side of the light emitting regions of the plurality of light emitting units in a fourth direction, and the third direction is intersected with the fourth direction.

For example, in embodiments of the present disclosure, in each of the plurality of light emitting diode chips, a shortest distance between edges of the light emitting regions of adjacent light emitting units is not greater than 50 microns.

For example, in embodiments of the present disclosure, the plurality of light emitting diode chips are arrayed along a first direction and a second direction, and a pitch of the plurality of light emitting diode chips along at least one of the first direction and the second direction is not greater than 300 microns.

For example, in embodiments of the present disclosure, materials of the first color conversion layer and the second color conversion layer include a quantum dot material or a fluorescent material.

For example, in embodiments of the present disclosure, the first color light emitting unit is a blue light emitting unit, one of the second color light emitting unit and the third color light emitting unit is a red light emitting unit, and the other of the second color light emitting unit and the third color light emitting unit is a green light emitting unit.

At least one embodiment of the present disclosure provides a display device, including any display substrate as mentioned above.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

In research, the inventor(s) of the present application have found that during full-color display (for example, color display is realized by the cooperation of red sub-pixels, blue sub-pixels and green sub-pixels), the limitations of epitaxial materials of red LED chips (e.g., aluminum gallium indium phosphide, AlGaInP), such as many material defects, severe lattice vibration, increasing non-radiative recombination due to high recombination rate on the surface, etc., will lead to low efficiency of red LED chips.

Figure 1:
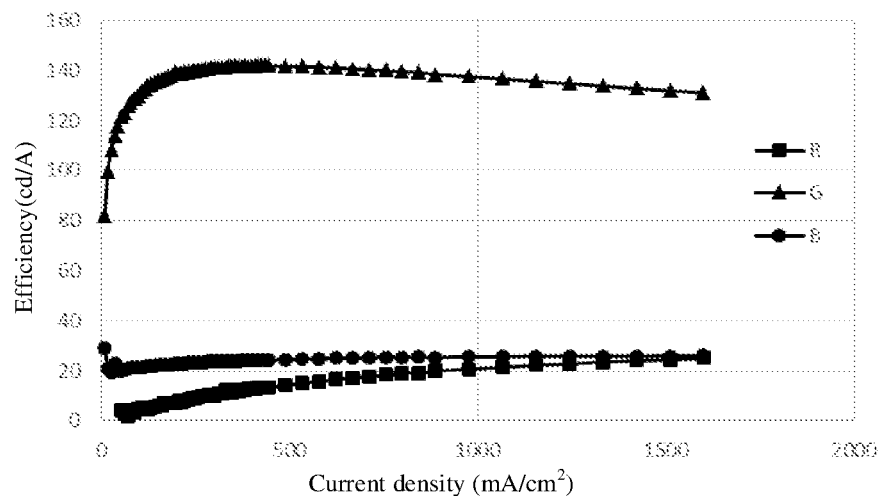
FIG. 1 is a diagram showing the relationship between current density and luminous efficiency of a red LED, that of a green LED and that of a blue LED during full-color display.

FIG. 1 shows the relationship between current density and luminous efficiency of a red (R) LED chip, that of a green (G) LED chip and that of a blue (B) LED chip during full-color display, and Table 1 shows the numerical relationship between current density and luminous efficiency of different color LED chips in two groups of LED chips. As shown in FIG. 1 and Table 1, taking that the brightness of the display panel is 2000 nit, the package transmittance (light transmittance of the display panel after being packaged) is 60%, the RGB white balance ratio is 3:6:1, and the aperture ratio of each pixel is 2% as an example, the efficiency of the red LED chip in the display panel is lower than that of the green LED chip and that of the blue LED chip, and the driving current density required by the red LED chip is larger, which is about 5 times that required by the green LED chip or the blue LED chip, thus increasing the power consumption of the display panel.

TABLE 1

|  | LED chip group 1 | LED chip group 2 |
|---|---|---|
| current density of R LED chip | 613.91(mA/cm$^2$) | 391.56(mA/cm$^2$) |
| current density of G LED chip | 231.83(mA/cm$^2$) | 78.85(mA/cm$^2$) |
| current density of B LED chip | 118.86(mA/cm$^2$) | 77.99(mA/cm$^2$) |
| luminous efficiency of R LED chip | 8.14(cd/A) | 12.77(cd/A) |
| luminous efficiency of G LED chip | 43.13(cd/A) | 126.81(cd/A) |
| luminous efficiency of B LED chip | 14.01(cd/A) | 21.37(cd/A) |

Figure 2:
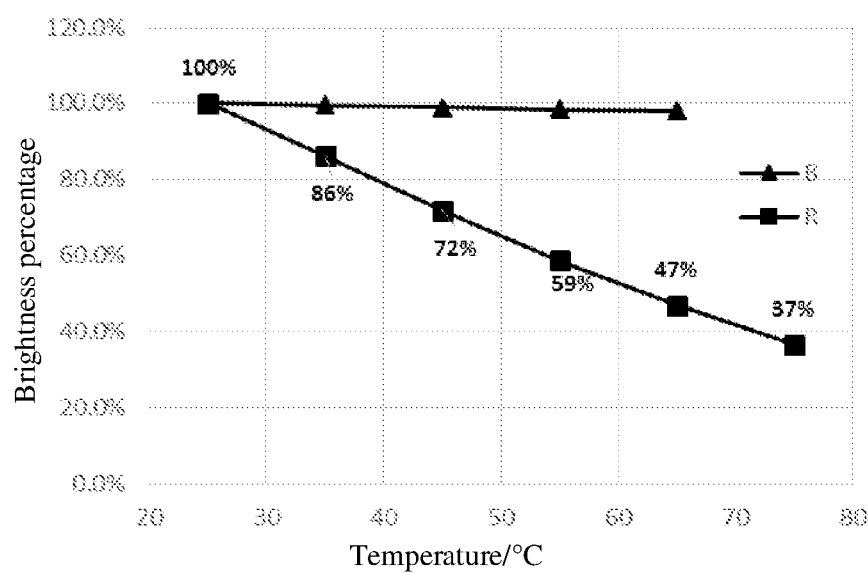
FIG. 2 is a diagram showing the relationship between luminous efficiency and temperature of a red LED and that of a green LED.

FIG. 2 shows the relationship between brightness percentage and temperature of a red LED chips and that of a green LED chip, and Table 2 shows the relationship between the brightness percentage and temperature of the red LED chip. As shown in FIG. 2 and Table 2, when the LED chip is in use, the temperature change will affect its luminous efficiency. For example, when the LED chip heats up, the non-radiative recombination ratio thereof will increase and the luminous efficiency thereof will decrease.

As shown in FIG. 2 and Table 2, with the increase of temperature, the brightness percentage of the red LED chip drops sharply, and especially at 50° C., its brightness percentage drops to about 40%. Generally, when the display panel displays normally, its temperature can reach about 50° C. In this case, the luminous efficiency of the red LED chip is low, which seriously affects the display quality of the display panel. In the case where the display panel displays a white picture, the abnormal display of the red LED chip will also cause the abnormal white balance. In order to compensate the brightness of the red light in the display panel, it is necessary to increase the current of the red LED chip, which will increase the power consumption of the display panel. Therefore, because the stability of the red LED chip is relatively poor, it will increase the power consumption of the whole device when it is matched with the blue LED chip and the green LED chip to realize color light emission.

TABLE 2

| Temperature/° C. | Percentage Decrease of Luminous Efficiency/% |
|---|---|
| 40 | 25 |
| 50 | 40 |

In the display panel including red LED chips, green LED chips and blue LED chips, it is difficult for the display panel to achieve high pixels per inch (ppi) because of the limitations, such as the locations of pads of the light emitting diode chips (LED pads), the size of light emitting diode chips and the precision of die bond technology, etc. For example, in the above-mentioned display panel, a plurality of light emitting diode chips are arranged in an array, and along the arrangement direction of the plurality of light emitting diode chips, the minimum pitch (e.g., the distance between geometric centers of adjacent light emitting diode chips) of the plurality of light emitting diode chips is about several hundred microns, which greatly limits the development direction of high pixels per inch of the display panel.

The embodiments of the present disclosure provide a display substrate and a display device. The display substrate includes a plurality of light emitting diode chips, each light emitting diode chip includes a plurality of light emitting units which respectively emit light of different colors, each light emitting unit includes a first electrode, a light emitting layer, a base and a second electrode, and the base and the second electrode are respectively located at both sides of the light emitting layer. In each light emitting diode chip, the plurality of light emitting units share the base and the first electrode, the light emitting layers of the plurality of light emitting units emit light of the same color, and at least one light emitting unit further includes a first color conversion layer located at a side of the base away from the light emitting layer, so as to convert first color light emitted by the light emitting layer into second color light. In the display substrate provided by the present disclosure, on the one hand, by dividing each light emitting diode chip to make the same light emitting diode chip emit light of at least two different colors, the high pixels per inch requirement of the display panel can be realized; on the other hand, the plurality of light emitting units included in each light emitting diode chip share one first electrode, so that the effective light emitting area of each light emitting unit can be increased as much as possible.

Hereinafter, the display substrate and the display device provided by the embodiments of the present disclosure will be described with reference to the accompanying drawings.

Figure 3:
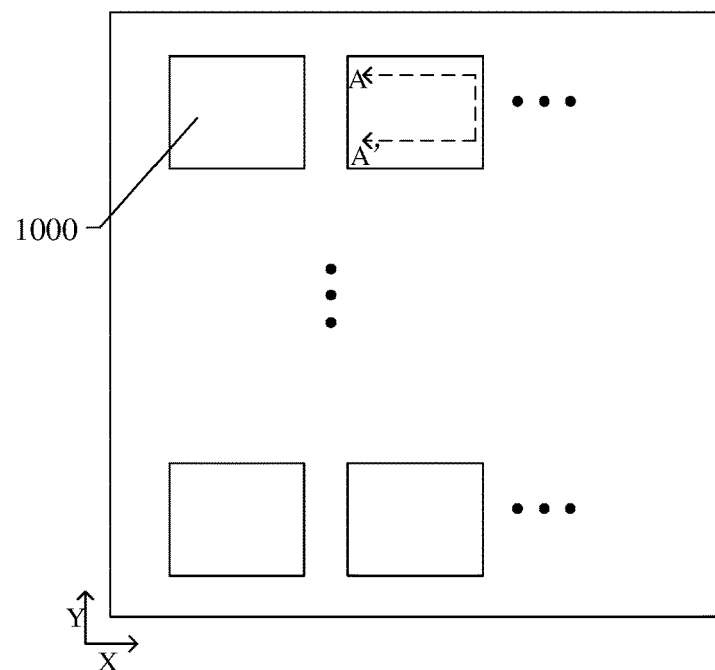
FIG. 3 is a schematic planar view of a display substrate provided by an embodiment of the present disclosure.
Figure 4:
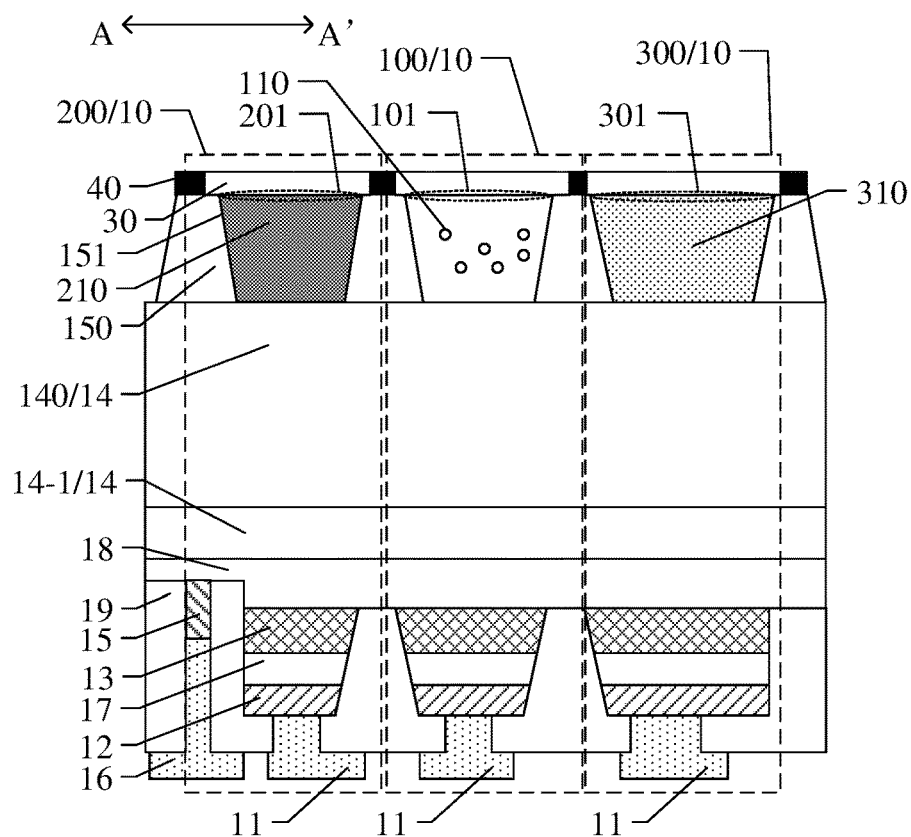
FIG. 4 is a partial cross-sectional structural view of the display substrate taken along line AA' as shown in FIG. 3.

FIG. 3 is a schematic planar view of a display substrate provided by an embodiment of the present disclosure, and FIG. 4 is a partial cross-sectional structural view of the display substrate taken along line AA' as shown in FIG. 3. As shown in FIG. 3 and FIG. 4, the display substrate includes a plurality of light emitting diode chips 1000. For example, the plurality of light emitting diode chips 1000 can be arrayed along a first direction (e.g., X direction) and a second direction (e.g., Y direction). FIG. 3 illustratively shows that the first direction and the second direction are perpendicular to each other, but it is not limited thereto; and the first direction and the second direction may not be perpendicular to each other, as long as they are intersected with each other. For example, the first direction and the second direction can be interchanged.

As shown in FIG. 3 and FIG. 4, each light emitting diode chip 1000 includes a plurality of light emitting units 10 which respectively emit light of different colors, and for example, at least two light emitting units 10 are included in each light emitting diode chip. Each light emitting unit 10 includes a second electrode 12, a light emitting layer 13 and a base 14 which are stacked in sequence, that is, the second electrode 12 and the base 14 are located at both sides of the light emitting layer 13, respectively. Each light emitting unit 10 further includes a first electrode 15, and for example, each light emitting unit 10 further includes a first contact pad 16 connected with the first electrode 15. In each light emitting diode chip 1000, the plurality of light emitting units 10 share the base 14 and the first electrode 15, the light emitting layers 13 of the plurality of light emitting units 10 emit light of the same color, and at least one light emitting unit 10 further includes a first color conversion layer 210 located at a side of the base 14 away from the light emitting layer 13, so as to convert first color light emitted by the light emitting layer 13 into second color light. In the display substrate provided by the present disclosure, on the one hand, by dividing each light emitting diode chip to make the same light emitting diode chip emit light of at least two different colors, the high pixels per inch requirement of the display panel can be realized; on the other hand, the plurality of light emitting units included in each light emitting diode chip share one first electrode, so that the effective light emitting area of each light emitting unit can be increased as much as possible.

For example, in each light emitting diode chip 1000, the plurality of light emitting units 10 share one first contact pad 16.

For example, as shown in FIG. 4, each light emitting diode chip 1000 includes one first electrode 15 and a plurality of second electrodes 12, each light emitting unit 10 includes one second electrode 12, and the plurality of light emitting units 10 share the one first electrode 15. The orthographic projection of the first contact pad 16 on the base 14 should be prevented from overlapping with the orthographic projection of the light emitting layer 13 of each light emitting unit 10 on the base 14. By providing the first contact pad 16, the effective area of the first electrode 15 upon being electrically connected with other electrical structures (e.g., terminals, pads, etc.) can be expanded, and at the same time, it is ensured that the effective light emitting area of each light emitting unit is not lost.

For example, as shown in FIG. 4, each light emitting unit 10 further includes a first conductivity type semiconductor layer 18 between the light emitting layer 13 and the base 14, and a second conductivity type semiconductor layer 17 between the light emitting layer 13 and the second electrode 12. The first conductivity type semiconductor layer 18 is connected with the first electrode 15, and the second conductivity type semiconductor layer 17 is connected with the second electrode 12.

For example, as shown in FIG. 4, the base 14 includes a sapphire layer 140, and a buffer layer 14-1 between the sapphire layer 140 and the first conductivity type semiconductor layer 18, so that the first conductivity type semiconductor layer can be formed on the base more easily.

For example, as shown in FIG. 4, each light emitting diode chip further includes a barrier layer 19, configured to separate the light emitting layers 13, the second electrodes 12 and the second conductivity type semiconductor layers 17 of adjacent light emitting units 10, that is, the light emitting layers 13 of adjacent light emitting units 10 are separated from each other by the barrier layer 19, the second electrodes 12 of adjacent light emitting units 10 are insulated from each other by the barrier layer 19, and the second conductivity type semiconductor layers 17 of adjacent light emitting units 10 are separated from each other by the barrier layer 19.

For example, in each light emitting diode chip, the plurality of light emitting layers 13 of the plurality of light emitting units 10 can be made of the same material, so that the light emitting layers 13 of the plurality of light emitting units 10 can emit light of the same color.

For example, in each light emitting diode chip, the plurality of second electrodes 12 of the plurality of light emitting units 10 can be made of the same material, but not limited thereto, and different materials can also be adopted. The plurality of second conductivity type semiconductor layers 17 of the plurality of light emitting units 10 can be made of the same material, but not limited thereto, and different materials can also be adopted.

For example, as shown in FIG. 4, in each light emitting diode chip, the first conductivity type semiconductor layer 18 is a whole layer of semiconductor layer shared by the plurality of light emitting units 10, and the first electrode 15 serves as a common electrode of the plurality of light emitting units 10 by being connected with the shared first conductivity type semiconductor layer 18.

It should be noted that the above-mentioned "conductivity type" includes N type or P type. For example, the first conductivity type semiconductor layer can be an N-type semiconductor layer, and the second conductivity type semiconductor layer can be a P-type semiconductor layer. Of course, the embodiments of the present disclosure include but are not limited thereto, and the first conductivity type semiconductor layer can be a P-type semiconductor layer, and the second conductivity type semiconductor layer can be an N-type semiconductor layer.

For example, in the case where the first color light emitted by the light emitting layers of the plurality of light emitting units is blue light, the first conductivity type semiconductor layer is a P-type semiconductor layer, and the second conductivity type semiconductor layer is an N-type semiconductor layer.

For example, the first conductivity type semiconductor layer 18 is a P-type semiconductor layer, and the second conductivity type semiconductor layer 17 is an N-type semiconductor layer. Holes and electrons are injected into the second conductivity type semiconductor layer 17 and the first conductivity type semiconductor layer 18 from the second electrode 12 and the first electrode 15, respectively, and recombine in the light emitting layer 13, which is presented as releasing energy in the form of photons. And the light emitting wavelength depends on the band gap width of the light emitting material.

For example, in some examples, the first conductivity type semiconductor layer 18 is an N-type gallium nitride layer, and the second conductivity type semiconductor layer 17 is a P-type gallium nitride layer. Of course, the embodiments of the present disclosure include but are not limited thereto, and the first conductivity type semiconductor layer can be a P-type gallium nitride layer, and the second conductivity type semiconductor layer can be an N-type gallium nitride layer.

For example, in the case where the light emitting layer of each light emitting unit is configured to emit light in the blue-green band, gallium nitride (GaN) can be taken as the intrinsic semiconductor material of the first conductivity type semiconductor layer and that of the second conductivity type semiconductor layer. Of course, the embodiments of the present disclosure include but are not limited thereto, and the first conductivity type semiconductor layer and the second conductivity type semiconductor layer can also be made of other suitable materials.

For example, in some examples, the material of the light emitting layer 13 includes multiple quantum wells (MQW), and the multiple quantum wells are a system in which a plurality of quantum wells are combined together, thus improving the luminous intensity and luminous efficiency of the light emitting unit. Of course, the embodiments of the present disclosure include but are not limited thereto, and the light emitting layer as mentioned above can also be other suitable light emitting structures, such as a quantum well or a PN junction, etc.

For example, as shown in FIG. 4, each light emitting unit 10 further includes a plurality of second contact pads 11 arranged in the same layer as the first contact pad 16, and each second contact pad 11 is connected with a corresponding second electrode 12.

Because the second contact pad 11 is connected with the second electrode, the orthographic projection of the second contact pad 11 on the base 14 partially overlaps with the orthographic projection of the light emitting layer 13 of each light emitting unit 10 on the base 14. By providing the second contact pad 11, the effective area of the second electrode 15 upon being electrically connected with other electrical structures (e.g., terminals, pads, etc.) can be expanded.

For example, the distance between the first contact pad 16 and the second contact pad 11 is not less than a safe distance, so as to ensure that there will be no interference therebetween, and for example, the safe distance can be 30 microns. The safe distance refers to the shortest distance between two contact pads that can avoid short circuit (that is, the shortest distance between the edges of two contact pads that are close to each other). The embodiments of the present disclosure are not limited thereto, and the safe distance can be reduced according to the progress of the process technology.

For example, the materials of the first electrode 15 and the second electrode 12 in each light emitting unit 10 need to have good ohmic contact characteristics, so as to achieve good ohmic contact with the first conductivity type semiconductor 18 and the second conductivity type semiconductor layer 17, respectively, which is conducive to current transmission. Specifically, the materials of the first electrode 15 and the second electrode 12 can be at least a metal or alloy selected from the group consisting of aluminum, chromium, platinum, gold and silver. The materials of the first contact pad 16 and the second contact pad 11 need to consider the firmness when electrically connected with other electrical structures (e.g., terminals, pads, etc.), and the materials thereof can be at least a metal or alloy selected from the group consisting of tin, silver, copper, nickel and gold.

For example, as shown in FIG. 4, each light emitting diode chip includes a first color light emitting unit 100, a second color light emitting unit 200 and a third color light emitting unit 300, the first color light emitting unit 100 is configured to emit the first color light, the second color light emitting unit 200 further includes the first color conversion layer 210 located at a side of the base 14 away from the light emitting layer 13 and emits the second color light, and the third color light emitting unit 300 further includes a second color conversion layer 310 located at a side of the base 14 away from the light emitting layer 13, so as to convert the first color light emitted by the light emitting layer 13 into third color light.

For example, as shown in FIG. 4, a side of the base 14 is provided with the color conversion layer, and the other side of the base 14 is provided with the first conductivity type semiconductor layer 18, the light emitting layer 13, the second conductivity type semiconductor layer 17, the second electrode 12, the first electrode 15, the first contact pad 16 and the second contact pad 11.

For example, FIG. 4 illustratively shows that one light emitting diode chip includes one first color light emitting unit, one second color light emitting unit and one third color light emitting unit, but it is not limited thereto. The light emitting diode chip can include at least one first color light emitting unit, at least one second color light emitting unit and at least one third color light emitting unit.

For example, the first color light emitting unit 100 is a blue light emitting unit, one of the second color light emitting unit 200 and the third color light emitting unit 300 is a red light emitting unit, and the other of the second color light emitting unit 200 and the third color light emitting unit 300 is a green light emitting unit. For example, the second color light emitting unit is a green light emitting unit and the third color light emitting unit is a red light emitting unit, the first color light is blue light, the second color light is green light and the third color light is red light.

For example, blue light can excite the first color conversion layer 210 to emit green light and excite the second color conversion layer 310 to emit red light.

For example, the materials of the first color conversion layer 210 and the second color conversion layer 310 include quantum dot materials or fluorescent materials. For example, Quantum Dot (QD), also known as nanocrystals, generally have a particle size in the range of 1-20 nm. Because of the quantum confinement of electrons and holes, the continuous energy band structure becomes a discrete energy level structure with molecular characteristics, which can emit light of different color from the excitation light after quantum dot is excited.

For example, as shown in FIG. 4, a pixel defining portion 150 is provided at a side of the base 14 away from the light emitting layer 13, the pixel defining portion 150 includes a plurality of openings 151 to define a plurality of light emitting regions of the plurality of light emitting units 20, such as the first light emitting region 101 of the first color light emitting unit 100, the second light emitting region 201 of the second color light emitting unit 200 and the third light emitting region 301 of the third color light emitting unit 300. The first color conversion layer 210 is provided in the opening 151 of the second color light emitting unit 200, and the second color conversion layer 310 is provided in the opening 151 of the third color light emitting unit 300. For example, scattering particles 110 can be provided in the opening 151 of the first color light emitting unit 100, and for example, a transparent material including scattering particles 110 can be provided in the opening 151 of the first color light emitting unit 100. For example, the transparent material can be photoresist, such as acrylic system or silica gel system. The scattering particles 110 can include titanium dioxide ($TiO_2$), silicon dioxide ($SiO_2$), barium sulfate ($BaSO_4$), zirconium dioxide ($ZrO_2$) and other materials, and the size of the scattering particles 110 can be in the range of 200-300 nm. The light emitting region refers to a region defined by the opening of the pixel defining portion at a side of the base away from the light emitting layer. In the case where the cross section of the pixel defining portion is trapezoidal, the opening surrounded by the edge of the pixel defining portion away from the base is the light emitting region. The light emitting region is the region, from which light is emitted, in the color conversion layer or the film layer where the scattering particles are located.

For example, as shown in FIG. 4, the cross section of the pixel defining portion 150 between adjacent openings 151, which is perpendicular to the XY plane shown in FIG. 3, can be trapezoidal or rectangular, without being limited in the embodiments of the present disclosure. The XY plane can be a plane in which the plurality of light emitting diode chips are arrayed.

For example, as shown in FIG. 4, a color filter layer 30 is provided at a side of the color conversion layer away from the base 14. For example, a first color filter layer is provided at the side of the first color light emitting unit 100 where the opening 151 of the first color light emitting unit 100 is located; a second color filter layer is provided at the side of the second color light emitting unit 200 where the opening 151 of the second color light emitting unit 200 is located; and a third color filter layer is provided at the side of the third color light emitting unit 300 where the opening 151 of the third color light emitting unit 300 is located. For example, a black matrix 40 can also be arranged between adjacent color filter layers 30.

Figure 5:
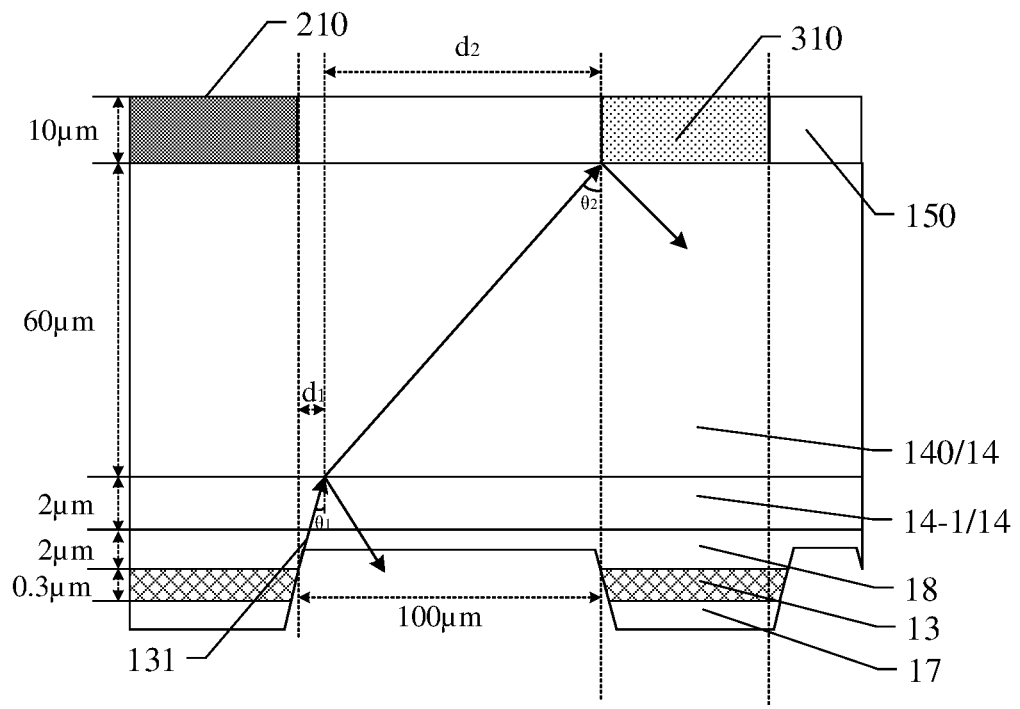
FIG. 5 is a partial cross-sectional structural view of a second color light emitting unit and a third color light emitting unit.

FIG. 5 is a partial cross-sectional structural view of a second color light emitting unit and a third color light emitting unit. As shown in FIG. 5, the material of the buffer layer 14-1 can be gallium nitride.

Because the thickness of the sapphire layer is large (e.g., greater than 60 microns), cross color may easily occur to adjacent light emitting units. For example, the light emitted by the light emitting layer of the second color light emitting unit is easy to enter the color conversion layer of the third color light emitting unit, or the light emitted by the light emitting layer of the third color light emitting unit is easy to enter the color conversion layer of the second color light emitting unit, and so on. Therefore, upon dividing each light emitting diode chip, it is necessary to consider the distance between the light emitting regions of adjacent light emitting units, not only to reduce the cross color scale between adjacent light emitting units as much as possible, but also to reduce the size of the light emitting diode chip as much as possible.

For example, the refractive index of the light emitting layer 13 is 2.54, the refractive index of the first conductivity type semiconductor layer 18 and the refractive index of the buffer layer 14-1 are both 2.45, the refractive index of the sapphire layer 140 is 1.77, and the refractive index of the first color conversion layer 210 and the refractive index of the second color conversion layer 310 are 1.5. In the case where the first color light emitted by the light emitting layer 13 passes through each film layer between the color conversion layer and the light emitting layer 13, total reflection occurs in the case where the angle of the incident light meets the total reflection critical angle. In the case where the incident angle of the light emitted by the light emitting layer is at least the total reflection critical angle upon being incident on the interface of each film layer, the cross color scale of the light emitted by adjacent light emitting units in the process of passing through the first conductivity type semiconductor layer, the buffer layer and the sapphire layer can be reduced as much as possible.

For example, as shown in FIG. 5, the incident angle of the light 131 emitted from the edge of the light emitting layer 13 of each color light emitting unit upon being total reflected at the interface between the buffer layer 14-1 and the sapphire layer 140 is a total reflection critical angle $\theta_1$, and the incident angle of the light 131 emitted from the edge of the light emitting layer 13 of each color light emitting unit upon being total reflected at the interface between the sapphire layer 140 and the color conversion layer is a total reflection critical angle $\theta_2$. According to the refractive index n of each film layer and the formula satisfied by the total reflection critical angle $\theta_c$, i.e., $\sin \theta_c = n_2/n_1$, $n_2 < n_1$, it is calculated that the total reflection critical angle $\theta_1$ is approximately 46° and the total reflection critical angle $\theta_2$ is approximately 58°.

For example, as shown in FIG. 5, the thickness of the light emitting layer 13 can be 0.3 microns, the thickness of the first conductivity type semiconductor layer 18 and that of the buffer layer 14-1 can both be 2 microns, the thickness of the color conversion layer can be 10 microns, and the thickness of the sapphire layer 140 can be reduced to 60 microns at most according to the existing process conditions. According to the total reflection critical angle $\theta_1$, the total thickness H of the first conductivity type semiconductor layer 18 and the buffer layer 14-1, and the equation of $d_1 = H \ast \tan \theta_1$, it can be calculated that $d_1$ is approximately 4.2 microns; and according to the thickness h of the sapphire layer 140, the total reflection critical angle $\theta_2$, and the equation of $d_2 = h \ast \tan \theta_2$, it can be calculated that $d_2$ is approximately 95.8 microns. Therefore, the distance ($d_1+d_2$) between the light emitting regions of adjacent light emitting units is approximately 100 microns, and the cross color scale between adjacent light emitting units can be greatly reduced in the case where the distance between adjacent light emitting units is not less than 100 microns.

Of course, in the case where the thickness of at least one film layer changes, or the material of the at least one film layer changes, resulting in a change in refractive index, the distance between the light emitting regions of adjacent light emitting units will also change.

For example, Table 3 is a numerical relationship table obtained by simulation after setting the distance between the above-mentioned adjacent light emitting units to a distance of not less than 100 microns. As shown in Table 3, the brightness of red light emitted by the red light emitting unit, green light emitted by the green light emitting unit and blue light emitted by the blue light emitting unit in the display panel are acquired by a full-face receiver, and it is obtained that the luminance of red light is $7.05 \ast 10^{10}$ Lux, the luminance of green light is $6.91 \ast 10^{10}$ Lux, and the luminance of blue light is $6.05 \ast 10^{10}$ Lux.

TABLE 3

| | Luminance(Lux) | | | Cross Color Scale (%) | | |
|---|---|---|---|---|---|---|
| Type of Receiver | Red light emitting unit (R) | Green light emitting unit (G) | Blue light emitting unit (B) | R | G | B |
| Full-face receiver | $7.05 \ast 10^{10}$ | $6.91 \ast 10^{10}$ | $6.05 \ast 10^{10}$ | | | |
| Local receiver (point R) | $2.02 \ast 10^{10}$ | $4.27 \ast 10^7$ | $1.73 \ast 10^7$ | | 0.061795 | 0.028595 |
| Local receiver (point G) | $5.14 \ast 10^7$ | $1.78 \ast 10^{10}$ | $1.00 \ast 10^8$ | 0.072907 | | 0.165289 |
| Local receiver (point B) | $7.67 \ast 10^7$ | $3.20 \ast 10^8$ | $4.93 \ast 10^9$ | 0.108794 | 0.463097 | |

In the case where a local receiver is used to acquire the brightness of the region where the red light emitting unit is located, the luminance of red light is $2.02*10^{10}$ Lux, the luminance of green light being received is $5.14*10^7$ Lux, and the luminance of blue light being received is $7.67*10^7$ Lux. Therefore, the cross color scale of the green light emitting unit with respect to the red light emitting unit is approximately 0.07%, and the cross color scale of the blue light emitting unit with respect to the red light emitting unit is approximately 0.11%.

In the case where a local receiver is used to acquire the brightness of the region where the green light emitting unit is located, the luminance of the green light emitting unit is $1.78*10^{10}$ Lux, the luminance of the red light emitting unit being received is $4.27*10^7$ Lux, and the luminance of the blue light emitting unit being received is $3.20*10^8$ Lux. Therefore, the cross color scale of the red light emitting unit with respect to the green light emitting unit is approximately 0.06%, and the cross color scale of the blue light emitting unit with respect to the green light emitting unit is approximately 0.46%.

In the case where a local receiver is used to acquire the brightness of the region where the blue light emitting unit is located, the luminance of the blue light emitting unit is $4.93*10^9$ Lux, the luminance of the red light emitting unit being received is $1.73*10^7$ Lux, and the luminance of the green light emitting unit being received is $1.00*10^8$ Lux. Therefore, the cross color scale of the red light emitting unit with respect to the blue light emitting unit is approximately 0.03%, and the cross color scale of the green light emitting unit with respect to the blue light emitting unit is approximately 0.17%.

As can be viewed from the simulation results shown in Table 3, each cross color scale is less than 1%.

For example, the first color conversion layer is configured to convert the incident blue light into green light, the second color conversion layer is configured to convert the incident blue light into red light, and the blue light emitted by the light emitting layer in the first color light emitting unit is directly emitted without conversion; then the blue light conversion efficiency of the first color light emitting unit can be regarded as 1, the conversion efficiency of the first color conversion layer in the second color light emitting unit to convert blue light into green light can be 0.483, and the conversion efficiency of the second color conversion layer in the third color light emitting unit to convert blue light into red light can be 1.112.

For example, Table 4 shows the color coordinate data of red light emitted by the red light emitting unit, green light emitted by the green light emitting unit and blue light emitted by the blue light emitting unit, as well as the white point coordinates of white balance realized after mixing.

TABLE 4

|  | x | y | z |
|---|---|---|---|
| Red light emitted by red light emitting unit | 0.695 | 0.302 | 0.003 |
| Green light emitted by green light emitting unit | 0.137 | 0.79 | 0.073 |
| Blue light emitted by blue light emitting unit | 0.1446 | 0.0362 | 0.8192 |
| White light formed by mixing | 0.28 | 0.29 | 0.43 |

For example, as shown in Table 4, the color coordinates (x,y,z) of red light emitted by the red light emitting unit are (0.695, 0.302, 0.003), the color coordinates (x,y,z) of green light emitted by the green light emitting unit are (0.137, 0.79, 0.073), the color coordinates of blue light emitted by the blue light emitting unit are (0.1446, 0.0362, 0.8192), and the white point coordinates of white light formed by mixing are (0.28, 0.29, 0.43).

According to the above color coordinate data, the white balance proportion of red light, green light and blue light is 0.2598:0.6776:0.0626. Of course, in the case where the color coordinate data of different color light emitted by different light emitting units are different, the white balance proportion of different color lights is also different.

For example, the brightness of blue light emitted by the light emitting layers of different color light emitting units in the light emitting diode chip is set as the same brightness, and the quantum dot material in the color conversion layer can be irradiated with the light having the same brightness, thus ensuring that different color conversion layers have the same service life as much as possible.

In some embodiments, the areas of light emitting regions of different color light emitting units are different.

For example, in terms of a 55-inch display panel with a resolution of 4K, the pixel pitch can be set to 318 microns. According to the size of the light emitting diode chip and the standard of 1000-nit required brightness of the display panel, the aperture ratios of light emitting units of different colors in the light emitting diode chip are designed. According to the conversion efficiencies of different color conversion layers and the white balance proportion of different color light, the area proportion of the light emitting regions of the red light emitting unit, the green light emitting unit and the blue light emitting unit is calculated to be 1.285:0.989:0.320, and the aperture ratios of the red light emitting unit, the green light emitting unit and the blue light emitting unit are 1.285%, 0.989% and 0.320% respectively. The aperture ratio refers to the ratio of the area of the light emitting region to the area of the pixel region, in which each pixel region includes three kinds of light emitting units of different colors, and the light emitting units of different colors can have light emitting regions of different areas.

Therefore, the area of the light emitting region of the red light emitting unit is greater than the area of the light emitting region of the green light emitting unit, and the area of the light emitting region of the green light emitting unit is greater than the area of the light emitting region of the blue light emitting unit.

For example, according to the area relationship between the light emitting regions of the light emitting units with different colors mentioned above, the light emitting region of the red light emitting unit can be set as a rectangle with a size of 25 μm*52 μm or a circle with a radius of 20.34 nm; the light emitting region of the green light emitting unit can be set as a rectangle with a size of 40 μm*25 μm or a circle with a radius of 17.84 nm; and the light emitting region of the blue light emitting unit can be set as a square with a size of 18 μm*18 μm or a circle with a radius of 10.15 μm. The size setting of the light emitting regions of the color light emitting units mentioned above is exemplary, and each size can be changed within the range of ±10%.

Figure 6:
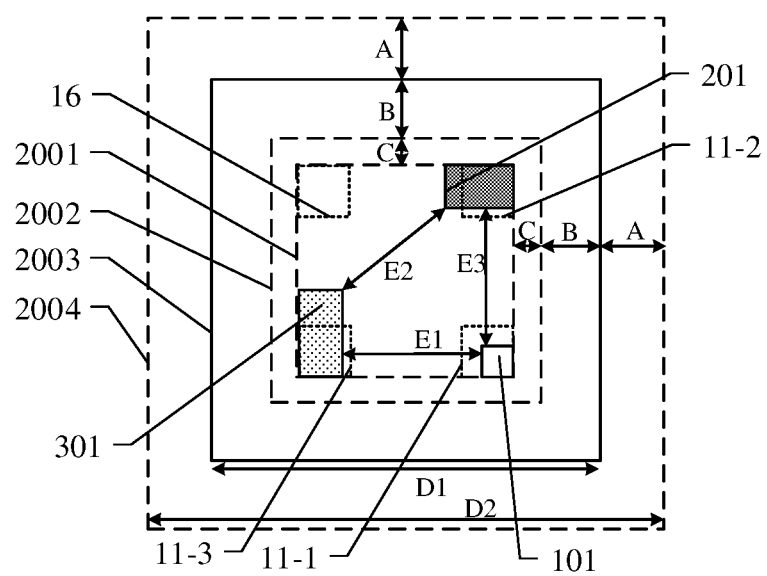
FIG. 6 and FIG. 7 are schematic diagrams of planar distribution of a plurality of light emitting units in a light emitting diode chip provided by an example of an embodiment of the present disclosure.
Figure 7:
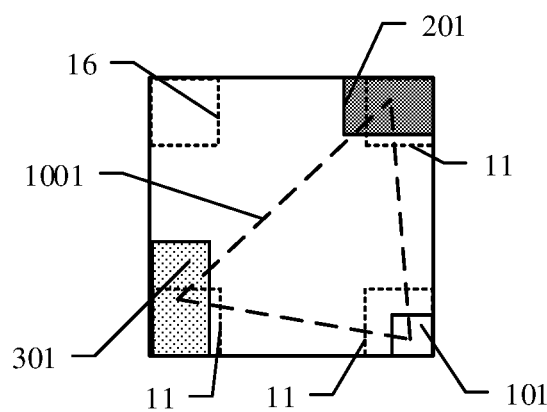

For example, FIG. 6 and FIG. 7 are schematic diagrams of planar distribution of a plurality of light emitting units in a light emitting diode chip provided by an example of an embodiment of the present disclosure. The AA' line shown in FIG. 3 is a cross-sectional line taken along the distribution structure of the plurality of light emitting units shown in FIG. 6. As shown in FIG. 6 and FIG. 7, in each light emitting diode chip, connection lines between the geometric centers of the light emitting region 101 of the first color light emitting unit, the light emitting region 201 of the second color light emitting unit and the light emitting region 301 of the third color light emitting unit form a first triangle 1001, and the ratio of the shortest distances between the edges of the light emitting regions of different color light emitting units is in the range of 0.6 to 1.5. For example, the ratio of the shortest distances between the edges of the light emitting regions of different color light emitting units is in the range of 0.8 to 1.2. For example, the ratio of the shortest distances between the edges of the light emitting regions of different color light emitting units is in the range of 0.9 to 1.1.

The geometric center mentioned above refers to the geometric center of the shape of the light emitting region.

The above-mentioned "shortest distance between the edges of light emitting regions of different color light emitting units" refers to, for example, the shortest distance E3 between edges, which are close to each other, of the light emitting region 101 of the first color light emitting unit and the light emitting region 201 of the second color light emitting unit, the shortest distance E2 between edges, which are close to each other, of the light emitting region 201 of the second color light emitting unit and the light emitting region 301 of the third color light emitting unit, and the shortest distance E1 between edges, which are close to each other, of the light emitting region 101 of the first color light emitting unit and the light emitting region 301 of the third color light emitting unit.

For example, E1 is not less than 100 microns, such as 100 microns; E2 is not less than 100 microns, such as 102 microns; and E3 is not less than 100 microns, such as 100 microns.

For example, as shown in FIG. 6 and FIG. 7, the light emitting regions of the plurality of light emitting units in each light emitting diode chip are distributed in a rectangular region 2001, and the light emitting region 101 of the first color light emitting unit, the light emitting region 102 of the second color light emitting unit and the light emitting region 103 of the third color light emitting unit are located at three right angles of the rectangular region 2001, respectively.

For example, as shown in FIG. 6, in the case where the shape of each light emitting region is rectangular, two adjacent edges of each light emitting region can overlap with two adjacent edges of the rectangular region 2001, and one right angle of each light emitting region can overlap with one right angle of the rectangular region 2001, and three right angles of three light emitting regions overlap with three right angles of the rectangular region 2001, respectively. Thus, the intersection of the edges of the plurality of light emitting regions can define the rectangular region 2001. The embodiments of the present disclosure are not limited thereto. In the case where the shape of each light emitting region is circular, the edge of the rectangular region can be a tangent of the circle.

As shown in FIG. 6, in some embodiments, the rectangular region 2001 is located in the outline 2002 of the pixel defining portion 150, and the distance C between the outline 2002 of the pixel defining portion 150 and the rectangular region 2001 can be in the range of 15 to 20 microns. The pixel defining portion 150 can be made of a light-absorbing material, such as a dark resin material. The thickness of the pixel defining portion is basically the same as that of the color conversion layer, and for example, it can be in the range of 10 to 15 microns. In some embodiments, a cutting line 2003 can be provided at the periphery of the pixel defining portion. It can be understood that the light emitting diode chip master sheet can include a plurality of light emitting diode chips, and a plurality of light emitting diode chips can be obtained by cutting the Light emitting diode chip master sheet along the cutting lines 2003. Therefore, the cutting line 2003 is the outline of each light emitting diode chip. For example, the distance B between the cutting line 2003 and the outline 2002 of the pixel defining portion is in the range of 10 to 20 microns. Upon designing pixels for the display substrate, the region surrounded by each pixel region 2004 should be slightly greater than the outline of each light emitting diode chip, that is, the cutting line 2003. A plurality of pixel regions 2004 of the display substrate are sequentially adjacently arranged in an array, that is, the boundaries of adjacent pixel regions 2004 can overlap. There may be a distance A between the pixel region 2004 and the cutting line 2003, and the distance A can avoid the interference between light emitting diode chips. Specifically, the distance A can be in the range of 27.5 to 47.5 microns.

For example, as shown in FIG. 6, the boundary of the light emitting diode chip, that is, the cutting line 2003, for example, is rectangular, and a side length D1 of the light emitting diode chip can be 243 microns. For example, the pitch of light emitting diode chips can be 318 microns. For example, the pitch of light emitting diode chips refers to the distance between geometric centers of light emitting regions of adjacent light emitting diode chips along the arrangement direction of light emitting diode chips (e.g., at least one of the first direction and the second direction). For example, the pitch of the light emitting diode chips can be equal to the side length D2 of the pixel region 2004 shown in FIG. 6.

In the present disclosure, the plurality of light emitting units in the light emitting diode chip are distributed in a triangle, and the pitch of the light emitting diode chip can be set smaller while the cross color scale of light emitting units of different colors is greatly reduced.

For example, as shown in FIG. 6 and FIG. 7, in each light emitting diode chip, the second contact pad 11-1 of the first color light emitting unit, the second contact pad 11-2 of the second color light emitting unit and the second contact pad 11-3 of the third color light emitting unit can be respectively distributed at the above three right angles of the rectangular region 2001, and the first contact pad 15 is located at a fourth right angle of the rectangular region 2001. For example, each light emitting diode chip includes three second contact pads 11 and one first contact pad 15, and four contact pads are respectively distributed at four right angles of a rectangle.

For example, as shown in FIG. 6 and FIG. 7, in the case where the shape of each contact pad is rectangular, two adjacent sides of each contact pad can overlap with two adjacent sides of the rectangular region 2001, one right angle of each contact pad can overlap with one right angle of the rectangular region 2001, and four right angles of four contact pads overlap with four right angles of the rectangular region 2001, respectively. Therefore, the edges of four contact pads can define one rectangular region 2001. The embodiments of the present disclosure are not limited thereto. In the case where the shape of each contact pad is circular, the edge of the rectangular region can be a tangent of the circle. FIG. 6 and FIG. 7 illustratively show that the light emitting region of each light emitting unit overlaps with the second contact pad, but it is not limited thereto, and the light emitting region of each light emitting unit may not overlap with the second contact pad.

For example, the size of each contact pad can be 30 μm*30 μm, but it is not limited thereto, and the size can be adjusted by ±5%.

In the present disclosure, by arranging the four contact pads which are in the same layer at the four corners of the rectangle, it can be ensured that the minimum distance between the edges of any two contact pads in each light emitting diode chip is greater than the safe distance, so as to ensure that there will be no interference between them. For example, the safe distance can be 30 microns. The embodiments of the present disclosure are not limited thereto, and the safe distance can be reduced according to the progress of the process technology.

In the present disclosure, a plurality of light emitting units emitting light of different colors are arranged in the same light emitting diode chip, and the positions of the light emitting regions of the plurality of light emitting units and the positions of the contact pads of the plurality of light emitting units are set, which can not only greatly reduce the cross color scale between adjacent light emitting units, but also increase pixels per inch of the display substrate. In addition, by controlling the light emitting layers of different light emitting units of each light emitting diode chip to emit first color light with the same intensity, it can also be ensured that the service life of materials in different color conversion layers is approximately the same. In this case, white balance is realized by adjusting the areas of light emitting regions of different color light emitting units (aperture ratio). For example, the present disclosure provides a mini LED display substrate with anti-crosstalk and high-resolution characteristics.

Figure 8:
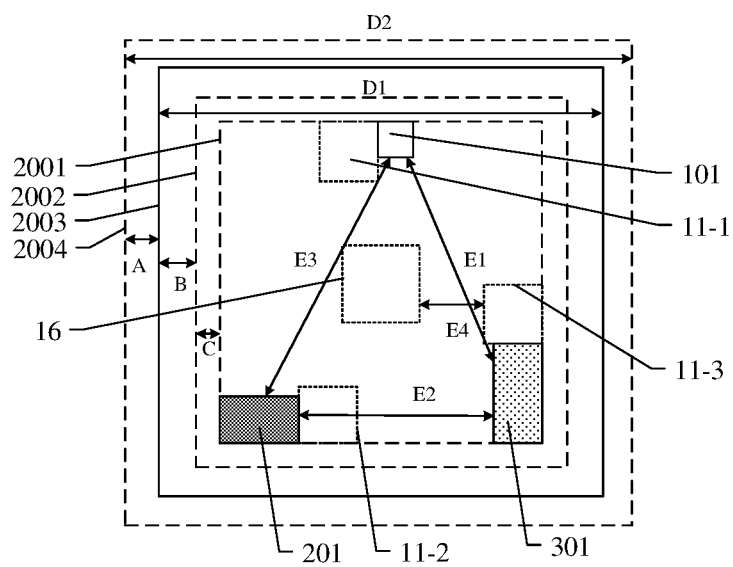
FIG. 8 and FIG. 9 are schematic diagrams of planar distribution of a plurality of light emitting units in a light emitting diode chip provided by another example of the embodiment of the present disclosure.
Figure 9:
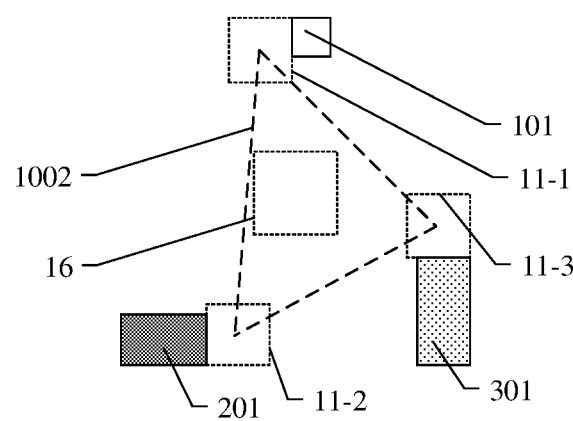

For example, FIG. 8 and FIG. 9 are schematic diagrams of planar distribution of a plurality of light emitting units in a light emitting diode chip provided by another example of the embodiment of the present disclosure. As shown in FIG. 8 and FIG. 9, in each light emitting diode chip, connection lines between the geometric centers of the light emitting region 101 of the first color light emitting unit, the light emitting region 201 of the second color light emitting unit and the light emitting region 301 of the third color light emitting unit form a first triangle, and the first triangle is an acute triangle.

For example, the shortest distance E1 between the edges, which are close to each other, of the light emitting region 101 of the first color light emitting unit and the light emitting region 301 of the third color light emitting unit is not less than 100 microns, such as 104 microns or 100 microns; the shortest distance E2 between the edges, which are close to each other, of the light emitting region 201 of the second color light emitting unit and the light emitting region 301 of the third color light emitting unit is not less than 100 microns, such as 100 microns; and the shortest distance E3 between the edges, which are close to each other, of the light emitting region 101 of the first color light emitting unit and the light emitting region 201 of the second color light emitting unit is not less than 100 microns, such as 129 microns or 100 microns.

For example, as shown in FIG. 8 and FIG. 9, the light emitting regions of the plurality of light emitting units in each light emitting diode chip are distributed in the rectangular region 2001, and two of the light emitting region 101 of the first color light emitting unit, the light emitting region 102 of the second color light emitting unit and the light emitting region 103 of the third color light emitting unit are located at two adjacent right angles in the rectangular region 2001, and the remaining one is located at the side opposite to the two adjacent right angles in the rectangular region 2001.

For example, as shown in FIG. 8, in the case where the shape of each light emitting region is rectangular, two adjacent sides of each light emitting region in the two adjacent light emitting regions located at two right angles overlap with two adjacent sides of the rectangular region 2001, and one right angle of each light emitting region in the two light emitting regions can overlap with one right angle of the rectangular region 2001; and one side of the light emitting region at the side of the rectangular region 2001 overlaps with the side of the rectangular region 2001. Therefore, a rectangular region 2001 can be defined by the edges of light emitting regions of different light emitting units.

For example, as shown in FIG. 8, the rectangular region 2001 is located in the outline 2002 of the pixel defining portion 150, and the distance C between the outline 2002 of the pixel defining portion 150 and the rectangular region 2001 can be in the range of 15 to 25 microns, such as 20 microns. For example, the distance B between the cutting line 2003 provided at the periphery of the pixel defining portion 150 and the outline 2002 of the pixel defining portion is in the range of 10 to 20 microns, such as 15 microns. For example, the distance A between the pixel region 2004 and the cutting line 2003 can be in the range of 27.5 to 47.5 microns, such as 37.5 microns.

For example, as shown in FIG. 8, the boundary of the light emitting diode chip, that is, the cutting line 2003, for example, has a shape of square, and the side length D1 of the light emitting diode chip can be 215 microns. For example, the pitch of the light emitting diode chips can be 252.5 microns. For example, the pitch of the light emitting diode chips can be equal to the side length D2 of the pixel region 2004 shown in FIG. 8.

For example, as shown in FIG. 8 and FIG. 9, in each light emitting diode chip, connection lines between the geometric centers of the second contact pad 11-1 of the first color light emitting unit, the second contact pad 11-2 of the second color light emitting unit and the second contact pad 11-3 of the third color light emitting unit form a second triangle 1002, and at least part of the first contact pad 15 is located in the second triangle 1002.

For example, the geometric center of the first contact pad 15 is located in the second triangle 1002. For example, the whole first contact pad 15 is located in the second triangle 1002.

For example, the distance E4 between the edges, which are close to each other, of the first contact pad 15 and the second contact pad 11-3 of the third color light emitting unit can be 32.5 microns. For example, the distance between the edges, which are close to each other, of the first contact pad 15 and the second contact pad of any other color light emitting unit is greater than a safe distance, such as 30 microns.

For example, as shown in FIG. 8 and FIG. 9, in the direction perpendicular to the plane where the first direction and the second direction are located, the light emitting region of each light emitting unit may or may not overlap with the second contact pad.

In the present disclosure, by arranging at least part of the first contact pad, which is in the same layer as the three second contact pads, in the triangle formed by the geometric centers of the three second contact pads, it can be ensured that the distance between any two contact pads in each light emitting diode chip is greater than the safe distance, so as to ensure that there will be no interference between them. For example, the safe distance can be 30 microns. The embodiments of the present disclosure are not limited thereto, and the safe distance can be reduced according to the progress of the process technology.

Figure 10:
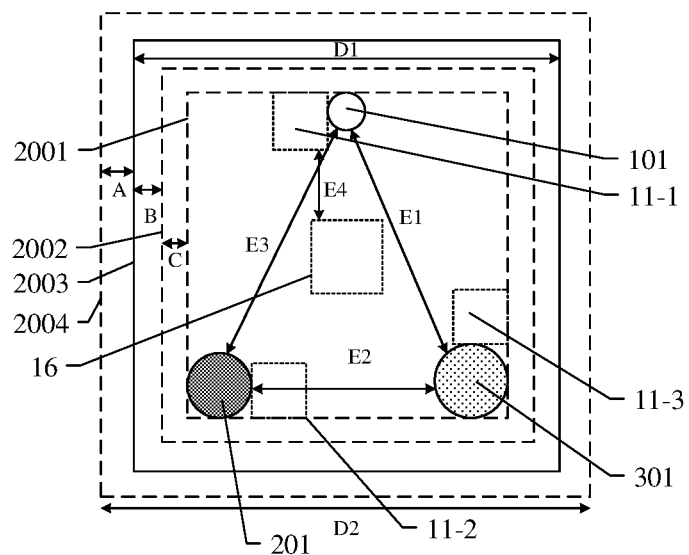
FIG. 10 is a schematic diagram of planar distribution of a plurality of light emitting units in a light emitting diode chip provided by another example of the embodiment of the present disclosure.

For example, FIG. 10 is a schematic diagram of planar distribution of a plurality of light emitting units in a light emitting diode chip provided by another example of the embodiment of the present disclosure. As shown in FIG. 10, in each light emitting diode chip, connection lines between the geometric centers of the light emitting region 101 of the first color light emitting unit, the light emitting region 201 of the second color light emitting unit and the light emitting region 301 of the third color light emitting unit form a first triangle, and the first triangle is an acute triangle.

For example, the shortest distance E1 between the edges, which are close to each other, of the light emitting region 101 of the first color light emitting unit and the light emitting region 301 of the third color light emitting unit is not less than 100 microns, such as 134 microns or 100 microns; the shortest distance E2 between the edges, which are close to each other, of the light emitting region 201 of the second color light emitting unit and the light emitting region 301 of the third color light emitting unit is not less than 100 microns, such as 100 microns; and the shortest distance E3 between the edges, which are close to each other, of the light emitting region 101 of the first color light emitting unit and the light emitting region 201 of the second color light emitting unit is not less than 100 microns, such as 140 microns or 100 microns.

For example, as shown in FIG. 10, the light emitting regions of the plurality of light emitting units in each light emitting diode chip are distributed in the rectangular region 2001, and two of the light emitting region 101 of the first color light emitting unit, the light emitting region 102 of the second color light emitting unit and the light emitting region 103 of the third color light emitting unit are located at two adjacent right angles in the rectangular region 2001, and the remaining one is located at the side opposite to the two adjacent right angles in the rectangular region 2001.

For example, as shown in FIG. 10, in the case where the shape of each light emitting region is circular, the edge of the rectangular region can be a tangent of the circle. For example, the shape of at least one light emitting region can also be oval or droplet-shaped.

For example, as shown in FIG. 10, the line width C of the pixel defining portion can be in the range of 15 to 25 microns, such as 20 microns. For example, the distance B between the cutting line 2003 and the outline 2002 of the pixel defining portion can be in the range of 10 to 20 microns, such as 15 microns. For example, the distance A between the pixel region 2004 and the cutting line 2003 can be in the range of 27.5 to 47.5 microns, such as 37.5 microns.

For example, as shown in FIG. 10, the boundary of the light emitting diode chip, that is, the cutting line 2003, for example, has a shape of square, and the side length D1 of the light emitting diode chip can be 226 microns. For example, the pitch of the light emitting diode chips can be 263.5 microns. For example, the pitch of the light emitting diode chips can be equal to the side length D2 of the pixel region 2004 shown in FIG. 10.

For example, as shown in FIG. 10, in each light emitting diode chip, connection lines between the geometric centers of the second contact pad 11-1 of the first color light emitting unit, the second contact pad 11-2 of the second color light emitting unit and the second contact pad 11-3 of the third color light emitting unit form a second triangle, and at least part of the first contact pad 15 is located in the second triangle.

For example, the geometric center of the first contact pad 15 is located in the second triangle 1002. For example, the whole first contact pad 15 is located in the second triangle.

For example, the distance E4 between the edges, which are close to each other, of the first contact pad 15 and the second contact pad 11-1 of the first color light emitting unit can be 38.5 microns. For example, the distance between the edges, which are close to each other, of the first contact pad 15 and the second contact pad of any other color light emitting unit is greater than a safe distance, such as 30 microns.

For example, as shown in FIG. 10, in the direction perpendicular to the plane where the first direction and the second direction are located, the light emitting region of each light emitting unit may or may not overlap with the second contact pad.

The shape of the light emitting region of each light emitting unit is not limited in the embodiments of the present disclosure. For example, it can also be a regular shape such as triangle, hexagon, droplet shape, or an irregular shape. For example, in each light emitting diode chip, the shapes of the light emitting regions of the plurality of light emitting units can be the same or different.

Figure 11:
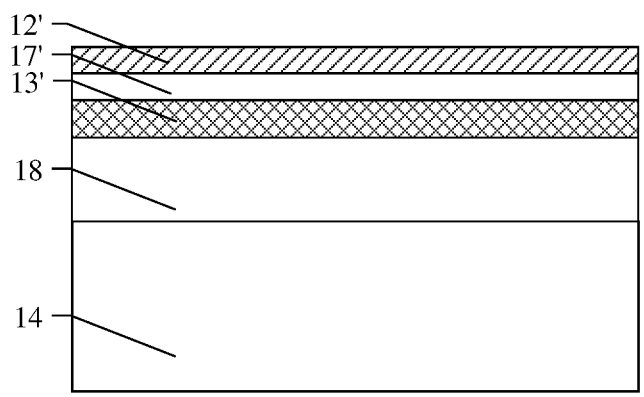
FIGS. 11-16 are partial process flowcharts of forming a light emitting diode chip.

For example, FIGS. 11-16 are partial process flowcharts of forming a light emitting diode chip. As shown in FIG. 11, a first conductivity type semiconductor layer 18, a light emitting material layer 13', a second conductivity type semiconductor material layer 17' and a second electrode material layer 12' are sequentially formed on a base 14 by metal-organic chemical vapor deposition process, thereby forming a LED master sheet. For example, the base 14 includes a sapphire substrate and a buffer layer, and the first conductivity type semiconductor layer 18 is formed on the buffer layer.

Figure 12:
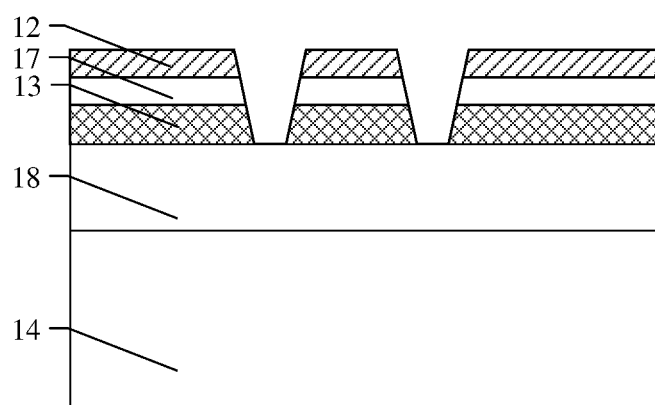

For example, as shown in FIG. 12, the LED master sheet is processed to include a plurality of light emitting units, and the light emitting material layer 13', the second conductivity type semiconductor material layer 17' and the second electrode material layer 12' are etched and divided by using a first mask as a mask to form a plurality of structures that are separated, each of which includes a light emitting layer 13, a second conductivity type semiconductor layer 17 and a second electrode layer 12. That is, a plurality of light emitting units are formed.

Figure 13:
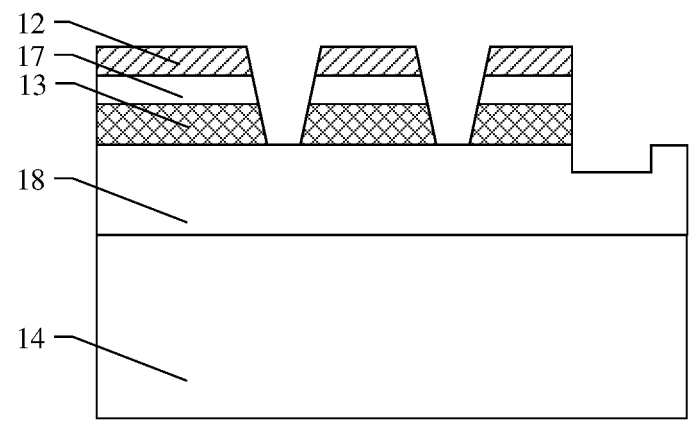

For example, as shown in FIG. 13, the first conductive type semiconductor layer 18 is etched by using a second mask plate as a mask, so that the light emitting layer 13, the second conductive type semiconductor layer 17 and the second electrode layer 12 on the first conductive type semiconductor layer 18 are partially etched away, and part of the first conductive type semiconductor layer 18 is etched away to form a recess or stepped structure.

Figure 14:
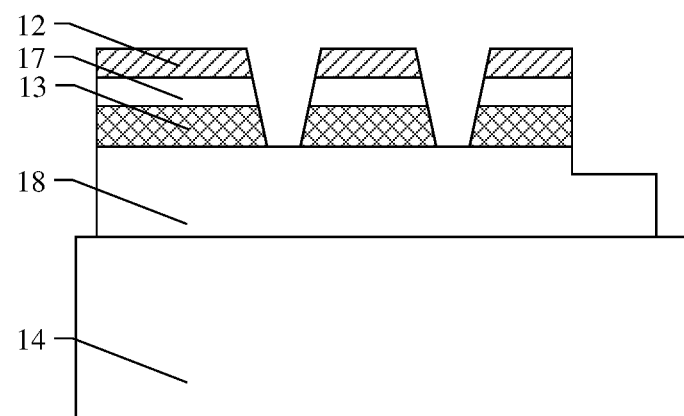

For example, as shown in FIG. 14, the first conductivity type semiconductor layer 18, the light emitting layer 13, the second conductivity type semiconductor layer 17 and the second electrode 12 are etched by using a fourth mask as a mask, and are etched to the base 14 to realize the division of the light emitting diode chips.

Figure 15:
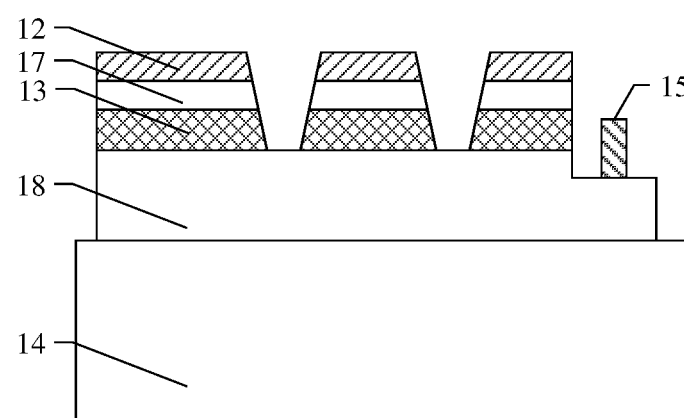

For example, as shown in FIG. 15, a first electrode 15 is formed on the first conductivity type semiconductor layer 18.

Figure 16:
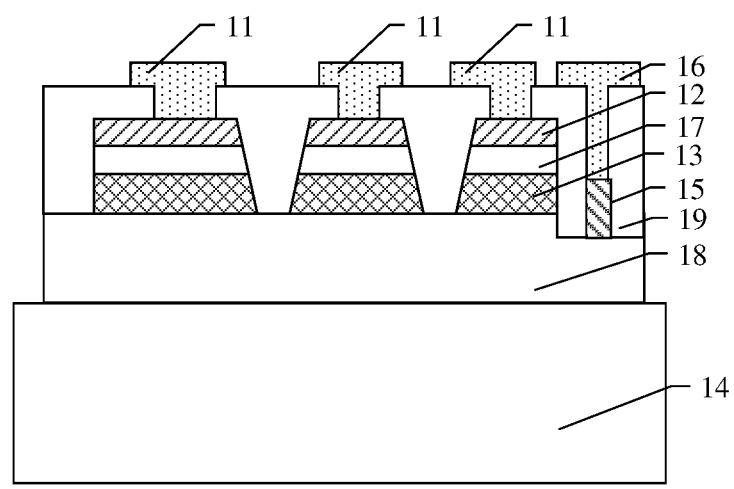

For example, as shown in FIG. 16, a barrier layer 19 is deposited at a side of the second electrode 12 away from the base 14 to block the light emitting layer 13, the second electrode 12 and the second conductivity type semiconductor layer 17 of adjacent light emitting units, that is, the light emitting layers 13 of adjacent light emitting units are separated from each other by the barrier layer 19, the second electrodes 12 of adjacent light emitting units are insulated from each other by the barrier layer 19, and the second conductivity type semiconductor layers 17 of adjacent light emitting units are separated from each other by the barrier layer 19. The barrier layer 19 is further configured to isolate the first electrode 15 from the light emitting layer 13, the second conductivity type semiconductor layer 17 and the second electrode 12. For example, contact pads 11 and 16 are formed on the barrier layer 19, the contact pad 16 connected with the first electrode 15 is a first contact pad 16, and the contact pad 11 connected with the second electrode 12 is a second contact pad 11.

For example, FIG. 15 and FIG. 16 illustratively show that the first electrode 15 is firstly formed and then the first contact pad 16 connected with the first electrode 15 is formed, but it is not limited thereto. And the first electrode 15 and the first contact pad 16 can also be formed at the same time.

For example, after the contact pad is formed, a protective layer is formed at a side of the contact pad away from the base to protect the contact pad.

For example, as shown in FIG. 4, after forming the protective layer, a pixel defining portion 150 having a plurality of openings 151 is formed by patterning at a side of the base 14 away from the light emitting layer 13, and then the first color conversion layer 210 and the second color conversion layer 310 are respectively formed in the opening 151 of the second color light emitting unit 200 and the opening 151 of the third color light emitting unit 300. For example, color conversion materials are formed in the openings 151 by printing. For example, the color conversion materials can include quantum dot materials or fluorescent materials. For example, scattering particles 110 can be formed in the opening 151 of the first color light emitting unit 100. For example, a transparent material including the scattering particles 110 can be formed in the opening 151 of the first color light emitting unit 100. For example, the transparent material can be photoresist, such as acrylic system or silica gel system. The scattering particles 110 can include titanium dioxide ($TiO_2$), silicon dioxide ($SiO_2$), barium sulfate ($BaSO_4$), zirconium dioxide ($ZrO_2$) and other materials, and the size of the scattering particles 110 can be in the range of 200-300 nm.

For example, as shown in FIG. 4, after the color conversion layer is formed, a color filter layer 30 is formed at a side of the color conversion layer away from the base 14.

Figure 17:
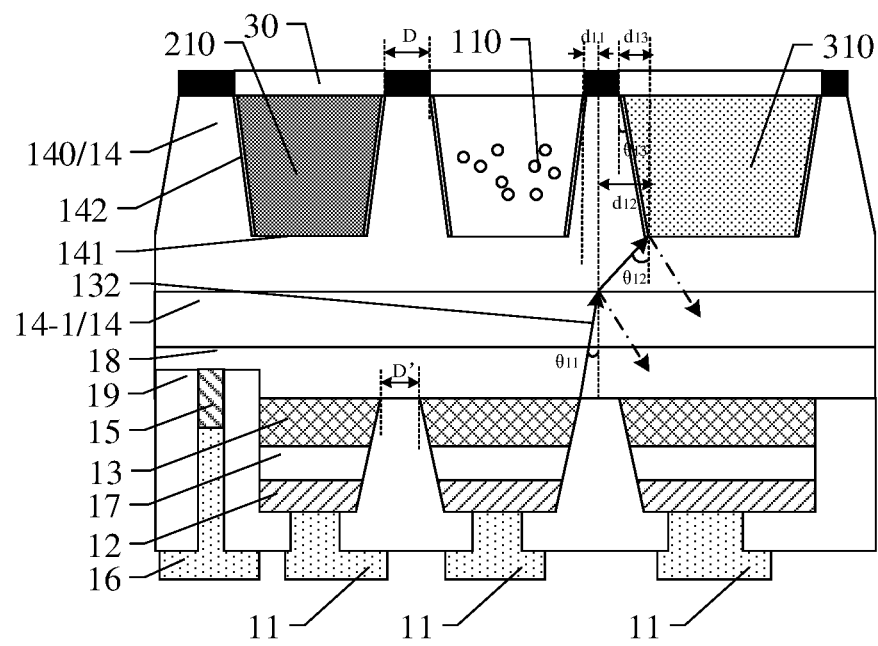
FIG. 17 is a partial cross-sectional structural view of a display substrate provided by an embodiment of the present disclosure.

For example, FIG. 17 is a partial cross-sectional structural view of a display substrate provided by an embodiment of the present disclosure. The difference between the laminated film layer structure of the display substrate shown in FIG. 17 and that of the display substrate shown in FIG. 4 is the structure at a side of the first conductivity type semiconductor layer 18 away from the light emitting layer 13. In the display substrates shown in FIG. 17 and FIG. 4, a second contact pad 11, a second electrode 12, a second conductivity type semiconductor layer 17, a light emitting layer 13 and a first conductivity type semiconductor layer 18, which are sequentially stacked, are provided at a side of the base 14 facing the light emitting layer 13, and the first conductivity type semiconductor layer 18, the first electrode 15 and the first contact pad 16 are shared by the plurality of light emitting units in each light emitting diode chip. The display substrate shown in FIG. 17 differs from the display substrate shown in FIG. 4 in that a side of the base 14 away from the light emitting layer 13 is provided with a plurality of grooves 141.

For example, as shown in FIG. 17, a plurality of grooves 141 are provided at a side of the sapphire layer 140 of the base 14 away from the light emitting layer 13.

For example, as shown in FIG. 17, the depth of at least one groove 141 is greater than 10 microns. For example, the depth of each groove 141 can be greater than half of the thickness of the sapphire layer 140. For example, the ratio of the depth of at least one groove 141 to the thickness of the sapphire layer 140 can be in the range of 0.5 to 0.9, such as 0.6 to 0.8.

For example, the sapphire layer 140 can have a thickness of 60 microns, and the groove 141 can have a depth of 55 microns.

For example, as shown in FIG. 17, each light emitting unit is provided with one groove 141, and in each light emitting unit, the groove 141 overlaps with the light emitting layer 13. For example, in each light emitting unit, the groove 141 is arranged opposite to the light emitting layer 13.

For example, a light shielding layer 142 is provided at the inner side wall of at least one groove 141. The "inner side wall" of the groove mentioned above and in the following refers to a circle of side walls at the inner side of the groove, excluding the bottom wall at the bottom opposite to the sapphire layer. The light shielding layer is configured to block the light emitted by the light emitting layers of other light emitting units from entering the groove.

For example, a light shielding layer 142 is provided at the inner side wall of each groove 141. For example, the light shielding layer 142 can be a reflective layer, thus efficiently reflecting the light incident onto the reflective layer while blocking the light of other light emitting units.

For example, as shown in FIG. 17, a first color conversion layer 210 is disposed in the groove 141 of the second color light emitting unit, and a second color conversion layer 310 is disposed in the groove 141 of the third color light emitting unit. For example, scattering particles 110 can be disposed in the groove 141 of the first color light emitting unit, and for example, a transparent material including the scattering particles 110, such as photoresist, can be provided.

For example, as shown in FIG. 17, there is a first gap D between the light emitting regions of adjacent light emitting units, and for example, the length of the first gap D can be $d_{11}+d_{12}-d_{13}$. There is a second gap D' between the edges, which are close to each other, of the light emitting layers of adjacent light emitting units, and along the arrangement direction of the light emitting units, the orthographic projections of the first gap D and the second gap D' on the surface of the base 140 facing the light emitting layer can completely overlap. The complete overlapping can mean that the overlapping ratio thereof is not less than 90%.

For example, as shown in FIG. 17, the refractive index of the light emitting layer 13 is 2.54, the refractive index of the first conductivity type semiconductor layer 18 and the refractive index of the buffer layer 14-1 are both 2.45, the refractive index of the sapphire layer 140 is 1.77, and the refractive index of the first color conversion layer 210 and the refractive index of the second color conversion layer 310 are 1.5. In the case where the first color light emitted by the light emitting layer 13 at the edge of the barrier opening of each color light emitting unit passes through each film layer between the color conversion layer and the light emitting layer 13, total reflection occurs in the case where the angle of the incident light meets the total reflection critical angle. In the case where the incident angle of the light emitted by the light emitting layer is at least the total reflection critical angle upon being incident on the interface of each film layer, the cross color scale of the light emitted by adjacent light emitting units in the process of passing through the first conductivity type semiconductor layer, the buffer layer and the sapphire layer can be reduced as much as possible.

In the present disclosure, the depth and width of the groove can be designed according to the position of the edge of the light emitting layer, the thickness of each film layer between the color conversion layer and the light emitting layer, and the position of the opening of the pixel defining portion. For example, the cross-sectional shape of the groove 141 cut by a plane perpendicular to the main surface of the base can be trapezoidal or rectangular, without being limited in the embodiments of the present disclosure. For example, in the case where the cross-sectional shape of the groove 141 is rectangular, the width of the groove can be 50 microns. For example, in the case where the cross-sectional shape of the groove 141 is trapezoidal, the length of the bottom side of the trapezoid close to the light emitting layer can be 50 microns.

For example, as shown in FIG. 17, the incident angle of the light 132 emitted from the edge of the light emitting layer 13 of each color light emitting unit upon being total reflected at the interface between the first conductivity type semiconductor layer 18 and the sapphire layer 140 is a total reflection critical angle $\theta_{11}$, and the incident angle of the light 132 emitted from the edge of the light emitting layer 13 of each color light emitting unit upon being total reflected at the interface between the sapphire layer 140 and the color conversion layer is a total reflection critical angle $\theta_{12}$. The lower edge of the groove 141 can be determined by the critical total reflection angle $\theta_{12}$. For example, the lower edge of the groove 141 can be at a position where the incident angle of the light emitted from the edge of the light emitting layer in the adjacent light emitting unit upon being incident on the edge of the color conversion layer is just the total reflection critical angle $\theta_{12}$, or a position closer to the center of the light emitting region than the above position is, so as to reduce cross color.

According to the refractive index n of each film layer and the formula satisfied by the total reflection critical angle $\theta_c$, i.e., $\sin \theta_c = n_2/n_1$, $n_2 < n_1$, it is calculated that the total reflection critical angle $\theta_{11}$ is approximately 46° and the total reflection critical angle $\theta_{12}$ is approximately 58°.

For example, as shown in FIG. 17, the thickness of the first conductivity type semiconductor layer 18 and that of the buffer layer 14-1 can both be 2 microns, and the thickness of the remaining part of the sapphire layer 140 other than the groove 141 can be 5 microns. According to the total reflection critical angle $\theta_{11}$, the total thickness H of the first conductivity type semiconductor layer 18 and the buffer layer 14-1, and the equation $d_{11} = H*\tan \theta_{11}$, it can be calculated that $d_{11}$ is approximately 4.14 microns; and according to the thickness h of the remaining part of the sapphire layer 140, the total reflection critical angle $\theta_{12}$, and the equation $d_{12} = h*\tan \theta_{12}$, it can be calculated that $d_{12}$ is approximately 8 microns. Assuming that the inclination angle $\theta_{13}$ of the side wall of the groove 141 is 5° and the depth of the groove 141 is 55 microns, then $d_{13}$ is approximately 4.8 microns, and the distance $(d_{11}+d_{12}-d_{13})$ between the light emitting regions of adjacent light emitting units is approximately 7.34 microns. In the case where the distance between the light emitting regions of adjacent light emitting units is not less than 8 microns, the cross color scale between adjacent light emitting units can be greatly reduced.

Of course, in the case where the thickness of each film layer changes or at least one of the inclination angle of the sidewall of the groove and the refractive index of the material of the sidewall of the groove changes, the distance between the light emitting regions of adjacent light emitting units will also change.

In the case where the color conversion layer is disposed in the groove of the base, compared with the case in which the base is not provided with the groove and the color conversion layer is provided at a side of the base away from the light emitting layer, the distance of the light emitting units can be reduced to less than 10 microns under the condition of minimizing the cross color scale (e.g., not more than 5%), so that the influence of the distance between adjacent light emitting units on the size of the light emitting diode chip can be minimized, making it possible for the display substrate to achieve high pixels per inch.

In the present disclosure, the groove is provided at a side of the base away from the light emitting layer, the light shielding layer is provided at the inner side wall of the groove, and the color conversion layer is disposed in the groove, so that the distance between the light emitting layer and the color conversion layer can be reduced, thereby reducing the distance between the light emitting regions of adjacent light emitting units and being beneficial to reducing the size of the light emitting diode chip and further increasing the pixels per inch of the display substrate. For example, the present disclosure provides a mini LED display substrate with high-resolution and low-crosstalk characteristics.

Figure 18:
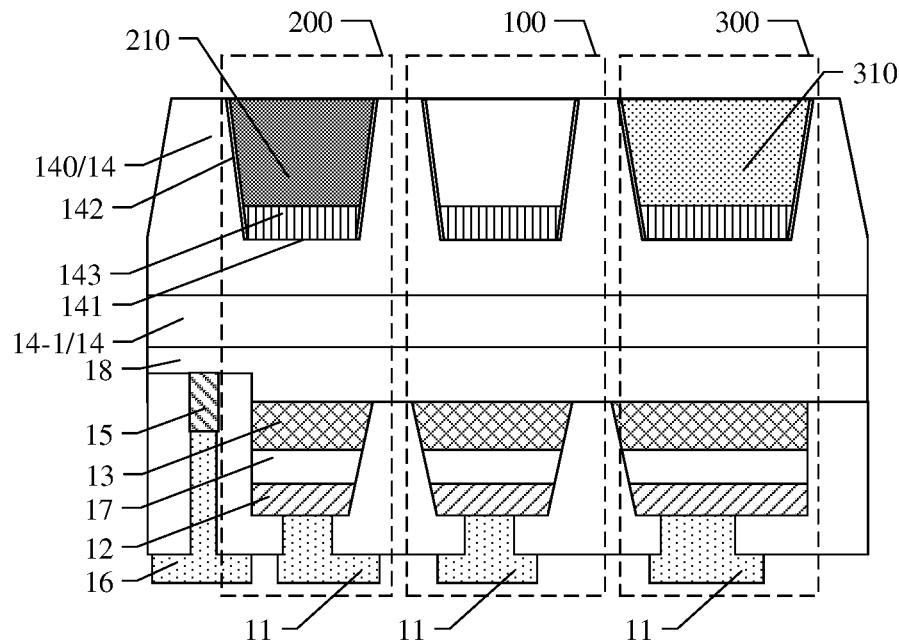
FIG. 18 is a partial cross-sectional structural view of a display substrate provided by an example of an embodiment of the present disclosure.

For example, FIG. 18 is a partial cross-sectional structural view of a display substrate provided by an example of an embodiment of the present disclosure. As shown in FIG. 18, a transparent filling layer 143 is disposed in the bottom of the groove 141 of at least one of the second color light emitting unit 200 and the third color light emitting unit 300. For example, the transparent filling layer 143 is located at the inner side of the groove 141.

For example, the depth of the groove 141 can be 55 microns, the thickness of the transparent filling layer 143 can be 25 microns, and the thickness of the color conversion layer can be 30 microns. For example, the thickness of the color conversion layer can be equal to the thickness of the transparent filling layer. The embodiments of the present disclosure are not limited thereto, and the thickness of the color conversion layer may not be greater than the thickness of the transparent filling layer.

For example, transparent filling layers 143 are disposed in the bottoms of the grooves 141 of the first color light emitting unit 100, the second color light emitting unit 200 and the third color light emitting unit 300.

For example, the material of the transparent filling layer 143 is a hydrophilic material, such as a material to which carboxyl groups, hydroxyl groups or ester groups are added.

In the present disclosure, a transparent filling layer is disposed in the groove where the quantum dot material is provided, and the thickness of the quantum dot material can be adjusted by adjusting the thickness of the transparent filling layer, so as to further adjust the conversion efficiency of the quantum dot material. For example, in the case where the display substrate is applied to use scenarios requiring high brightness, the thickness of the quantum dot material is relatively large; and in the case where the display substrate is applied to use scenarios requiring low brightness, the thickness of the quantum dot material is relatively small.

Figure 19:
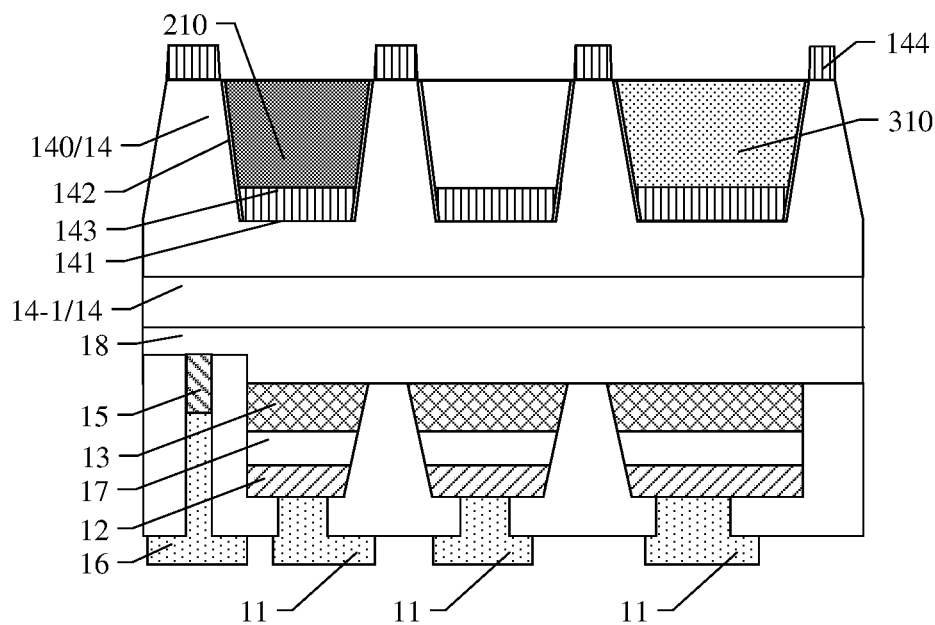
FIG. 19 is a partial cross-sectional structural view of a display substrate provided by an example of an embodiment of the present disclosure.

For example, FIG. 19 is a partial cross-sectional structural view of a display substrate provided by an example of an embodiment of the present disclosure. As shown in FIG. 19, a blocking portion 144 is provided at one side, away from the light emitting layer 13, of the gap between the grooves 141 of adjacent light emitting units, and the material of the blocking portion 144 includes a hydrophobic material, such as a fluorine-containing material. Because of the high polarity of fluorine, it will migrate to the surface, causing the quantum dot material to slip into the groove upon falling on the blocking portion.

FIG. 19 illustratively shows that both the blocking portion and the transparent filling layer are provided in the display substrate, but it is not limited thereto, and only the blocking portion or only the transparent filling layer may be provided.

For example, the cross-sectional shape of the blocking portion 144 cut by a plane perpendicular to the main surface of the base can be trapezoidal, rectangular or semicircular, etc.

For example, assuming that the distance between adjacent light emitting units is very small, and it is difficult to control the accurate entry of color conversion material (e.g., quantum dot materials) into the groove through printing process, the blocking portion 144 can be provided at one side, away from the light emitting layer 13, of the gap between the grooves of adjacent light emitting units, and the material of the blocking portion 144 includes a hydrophobic material, so that it is easy for the diffusion of the quantum dot material and controlling the size of the quantum dot region, and the risk of color cross can be better avoided.

For example, the material of the blocking portion 144 can be white, black or colorless photoresist.

Figure 20:
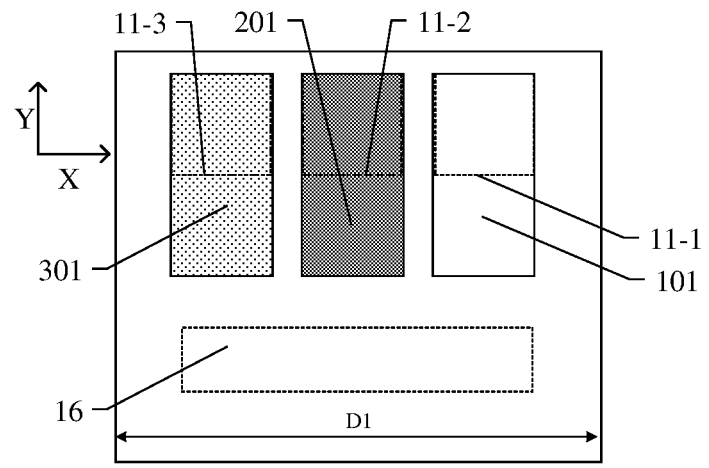
FIG. 20 is a schematic diagram of planar arrangement of light emitting regions of a plurality of light emitting units in the display substrate as shown in any one of FIGS. 17-19.

For example, FIG. 20 is a schematic diagram of planar arrangement of light emitting regions of a plurality of light emitting units in the display substrate as shown in any one of FIGS. 17-19. As shown in FIG. 20, in each light emitting diode chip, the light emitting regions of the plurality of light emitting units are arranged along a third direction, and for example, the light emitting region 101 of the first color light emitting unit, the light emitting region 201 of the second color light emitting unit and the light emitting region 301 of the third color light emitting unit are arranged along the third direction; the second contact pad 15 is located at a side of the light emitting regions of the plurality of light emitting units in a fourth direction, and the third direction is intersected with the fourth direction. For example, one of the third direction and the fourth direction can be parallel to the first direction, and the other of the third direction and the fourth direction can be parallel to the second direction, but it is not limited thereto. FIG. 17 illustratively shows that the third direction is the first direction, i.e., the X direction, and the fourth direction is the second direction, i.e., the Y direction.

For example, as shown in FIG. 20, the second contact pads 11 of the plurality of light emitting units are arranged along the third direction, that is, the second contact pad 11-1 of the first color light emitting unit, the second contact pad 11-2 of the second color light emitting unit and the second contact pad 11-3 of the third color light emitting unit are arranged along the third direction; and the second contact pad 15 is located at a side of the plurality of first contact pads 11 in the fourth direction.

For example, as shown in FIG. 20, the light emitting region of each light emitting unit can overlap with the second contact pad 11, and an overlapping part of the light emitting region and the second contact pad corresponds to a portion of the light emitting region away from the first contact pad 15 to ensure that the distance between the first contact pad and the second contact pad satisfies a safe distance. But it is not limited thereto, and the light emitting region of each light emitting unit may not overlap with the second contact pad 11.

For example, as shown in FIG. 20, in each light emitting diode chip, the shortest distance between the edges of the light emitting regions of adjacent light emitting units is not more than 50 microns. For example, in each light emitting diode chip, the shortest distance between the edges of the light emitting regions of adjacent light emitting units is not more than 30 microns. In each light emitting diode chip, the shortest distance between the edges of the light emitting regions of adjacent light emitting units is not more than 15 microns. In each light emitting diode chip, the shortest distance between the edges of the light emitting regions of adjacent light emitting units is not more than 10 microns.

For example, as shown in FIG. 20, the size of the light emitting region of each light emitting unit along the X direction can be 50 microns, and the size of the light emitting region of each light emitting unit along the Y direction can be 100 microns; the second contact pad 11 of each light emitting unit has a shape of square with a side length of 50 microns; and the size of the first contact pad 15 along the X direction can be 166 microns, and the size of the first contact pad 15 along the Y direction can be 30 microns.

For example, as shown in FIG. 20, the size of the light emitting diode chip along the X direction can be 226 microns. For example, the light emitting diode chip has a shape of square, and the side length D1 of the light emitting diode chip can be 226 microns.

For example, the present example is not limited to that the plurality of light emitting units in each light emitting diode chip are in the arrangement manner as shown in FIG. 20, and the plurality of light emitting units in each light emitting diode chip can also be in the arrangement manner as shown in FIGS. 6-10, so as to further reduce the size of the light emitting diode chip while ensuring a low cross color scale, thereby increasing the pixels per inch of the display substrate.

For example, in a plane parallel to the first direction and the second direction (or in a plane parallel to the third direction and the fourth direction), the maximum size of the light emitting diode chip is not more than 400 microns. The "maximum size" mentioned above can refer to the length of the diagonal line, side length or diameter, etc., of the planar shape of the light emitting diode chip. For example, in the case where the shape of the light emitting diode chip is polygonal, the maximum size of each light emitting diode chip in the above plane can be the length of the diagonal line of the polygon. For example, in the case where the shape of the light emitting diode chip is circular, the maximum size of each light emitting diode chip in the above plane can be the diameter.

For example, the pixels per inch of the display substrate can reach 100 or more. For example, by reducing the area of the light emitting region of the light emitting unit, the size of the light emitting diode chip will be further reduced. For example, the size of the light emitting region of the light emitting unit can be 20 μm*80 μm, and the size of the light emitting diode chip can be reduced to 136 microns, and the pixels per inch of the display substrate including the light emitting diode chips is about 200, which greatly improves the application level of the mini LED display products. For example, the light emitting diode chip can be directly bonded on a silicon-based circuit board, thus realizing a display substrate with high brightness and high pixels per inch.

Figure 21:
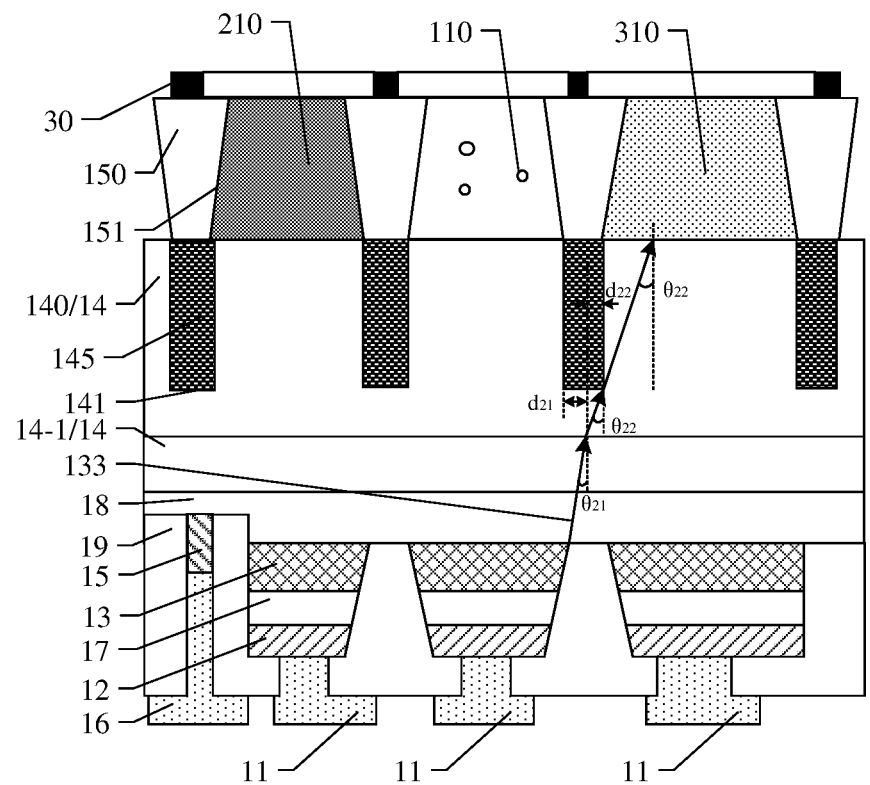
FIG. 21 is a partial cross-sectional structural view of a display substrate provided by an embodiment of the present disclosure.

For example, FIG. 21 is a partial cross-sectional structural view of a display substrate provided by an embodiment of the present disclosure. The difference between the laminated film layer structures of the display substrates shown in FIG. 21 and FIG. 17 is that a plurality of grooves 141 of the base 14 are at least partially arranged between adjacent light emitting units 20, and at least the inner side wall of each groove 141 is provided with a light shielding material 145. For example, some of the plurality of grooves 141 are arranged between adjacent light emitting units, and others of the plurality of grooves 141 are arranged between adjacent light emitting diode chips.

For example, the groove 141 can be fully filled with the light shielding material 145. For example, the groove 141 can be provided with the light shielding material only at the bottom and inner side wall, or the groove 141 may not be fully filled with the light shielding material 145. The light shielding material 145 is used to block the light emitted by the light emitting layers of other light emitting units from entering the color conversion layer.

For example, the light shielding material can be a metal material, and can also be a light-absorbing material.

Because of the large thickness of the sapphire layer (e.g., greater than 60 microns), cross color may easily occur to adjacent light emitting units. For example, the light emitted by the light emitting layer of the second color light emitting unit is easy to enter the color conversion layer of the third color light emitting unit, or the light emitted by the light emitting layer of the third color light emitting unit is easy to enter the color conversion layer of the second color light emitting unit, and so on. Therefore, by setting the groove in the base and setting the shielding material with light shielding effect in the groove, not only the cross color scale between adjacent light emitting units can be reduced as much as possible, but also the distance between the light emitting regions of adjacent light emitting units can be smaller, thus minimizing the size of the light emitting diode chip.

For example, as shown in FIG. 21, the refractive index of the light emitting layer 13 is 2.54, the refractive index of the first conductivity type semiconductor layer 18 and the refractive index of the buffer layer 14-1 are both 2.45, the refractive index of the sapphire layer 140 is 1.77, and the refractive index of the first color conversion layer 210 and the refractive index of the second color conversion layer 310 are 1.5. When the first color light emitted by the light emitting layer 13 at the edge of the barrier opening of each color light emitting unit passes through each film layer between the color conversion layer and the light emitting layer 13, total reflection occurs in the case where the angle of the incident light meets the total reflection critical angle. In the case where the incident angle of the light emitted by the light emitting layer is at least the total reflection critical angle upon being incident on the interface of each film layer, the cross color scale of the light emitted by adjacent light emitting units in the process of passing through the first conductivity type semiconductor layer, the buffer layer and the sapphire layer can be reduced as much as possible.

For example, as shown in FIG. 21, the incident angle of the light 133 emitted from the edge of the light emitting layer 13 of each color light emitting unit upon being total reflected at the interface between the buffer layer 14-1 and the sapphire layer 140 is a total reflection critical angle $\theta_{21}$, and the incident angle of the light 133 emitted from the edge of the light emitting layer 13 of each color light emitting unit upon being total reflected at the interface between the sapphire layer 140 and the color conversion layer is a total reflection critical angle $\theta_{22}$. According to the refractive index n of each film layer and the formula satisfied by the total reflection critical angle $\theta_c$, i.e., $\sin \theta_c = n_2/n_1$, $n_2 < n_1$, it is calculated that the total reflection critical angle $\theta_{21}$ is approximately 46° and the total reflection critical angle $\theta_{22}$ is approximately 58°. For example, as shown in FIG. 21, the position of the bottom edge of the groove 141 can be set according to the total reflection critical angle $\theta_{22}$ in the case where total reflection occurs at the interface between the sapphire layer 140 and the color conversion layer.

For example, as shown in FIG. 21, the thickness of the first conductivity type semiconductor layer 18 and that of the buffer layer 14-1 can both be 2 microns, the thickness of the sapphire layer 140 can be 60 microns, and the thickness of the remaining part of the sapphire layer 140 other than the groove 141 can be 5 microns. According to the total reflection critical angle $\theta_{21}$, the total thickness H of the first conductivity type semiconductor layer 18 and the buffer layer 14-1, and the equation $d_{21} = H \ast \tan \theta_{21}$, it can be calculated that $d_{21}$ is approximately 4.2 microns; and according to the thickness h of the remaining part of the sapphire layer 140, the total reflection critical angle $\theta_{22}$, and the equation $d_{22} = h \ast \tan \theta_{22}$, it can be calculated that $d_{22}$ is approximately 8 microns. Thus, the length $(d_{21}+d_{22})$ of the bottom edge of the groove is approximately 12 microns. Therefore, in the case where the thickness of the remaining part of the sapphire layer is 5 microns and the length of the bottom edge of the groove is approximately 12 microns, the optical crosstalk can be greatly reduced.

Of course, in the case where the thickness of each film layer changes, or the refractive index changes because of the change of material, the distance between the light emitting regions of adjacent light emitting units without cross color will also change.

For example, as shown in FIG. 21, a pixel defining portion 150 is provided at a side of the base 14 away from the light emitting layer 13, and the pixel defining portion 150 in the present example can have the same characteristics as the pixel defining portion shown in FIG. 4. For example, the cross-sectional shape of the pixel defining portion between adjacent light emitting units can be trapezoidal or rectangular, without being limited in the embodiments of the present disclosure.

For example, as shown in FIG. 21, at least part of the pixel defining portion 150 is stacked with the light shielding material layer 145. For example, the pixel defining portion 150 overlaps with the light shielding material layer 145 in the direction perpendicular to the plane where the first direction and the second direction are located.

For example, the ratio of the area of the surface of the pixel defining portion 150 facing the light shielding material layer 145 to the area of the surface of the light shielding material layer 145 facing the pixel defining portion 150 can be in the range of 0.9 to 1.1. For example, the area of the surface of the pixel defining portion 150 facing the light shielding material layer 145 can be greater than the area of the surface of the light shielding material layer 145 facing the pixel defining portion 150 by 5% of the area of the surface of the light shielding material layer 145.

FIG. 21 illustratively shows that the cross section of the groove is rectangular, but it is not limited thereto, and it can also have other shapes, such as trapezoid, etc.

Figure 22:
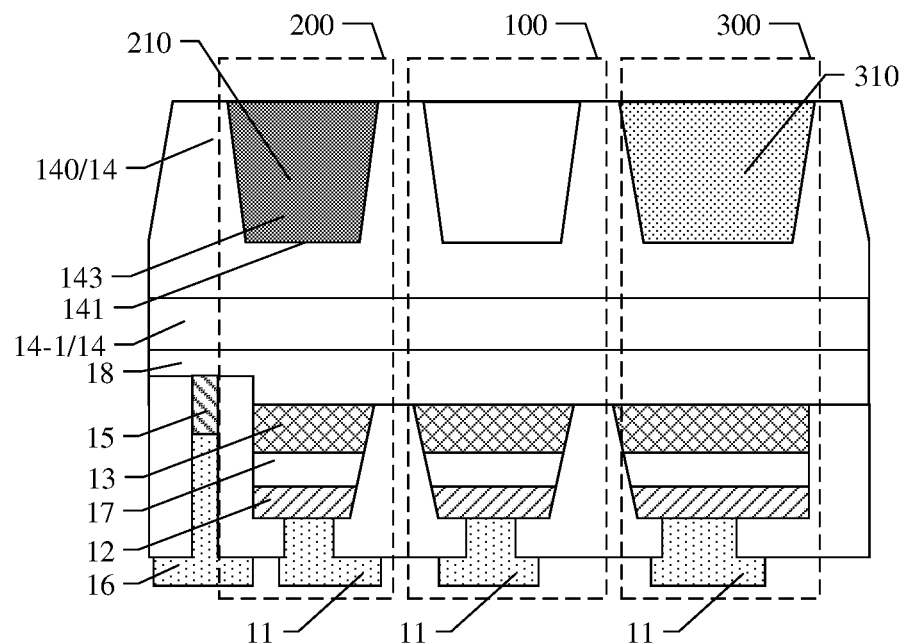
FIG. 22 is a schematic structural diagram of forming a groove in a sapphire layer of a light emitting diode chip and forming a color conversion layer in the groove.

For example, FIG. 22 is a schematic structural diagram of forming a groove in a sapphire layer of a light emitting diode chip and forming a color conversion layer in the groove. As shown in FIG. 22, after the first contact pad 16 and the second contact pad 11 are formed in the light emitting diode chip, the sapphire layer 140 is thinned, and for example, the sapphire layer 140 is polished to have a thickness of 60 microns. For example, after the sapphire layer 140 is polished, a plurality of grooves 141 are formed at a side of the base 14 away from the light emitting layer 13, e.g., at a side of the sapphire layer 140 away from the light emitting layer 13. For example, after the groove 141 is formed, a color conversion layer can be formed in the groove 141. FIG. 22 illustratively shows that the color conversion layer is formed in the groove, but it is not limited thereto. It is also allowed to form a light shielding layer and a filling layer in the groove before forming the color conversion layer. For example, after the color conversion layer is formed, the blocking portion 144 shown in FIG. 19 can be formed at a side of the sapphire layer 140 away from the light emitting layer 13, or the color filter layer 30 shown in FIG. 17 can be formed at a side of the color conversion layer away from the light emitting layer 13.

Figure 23:
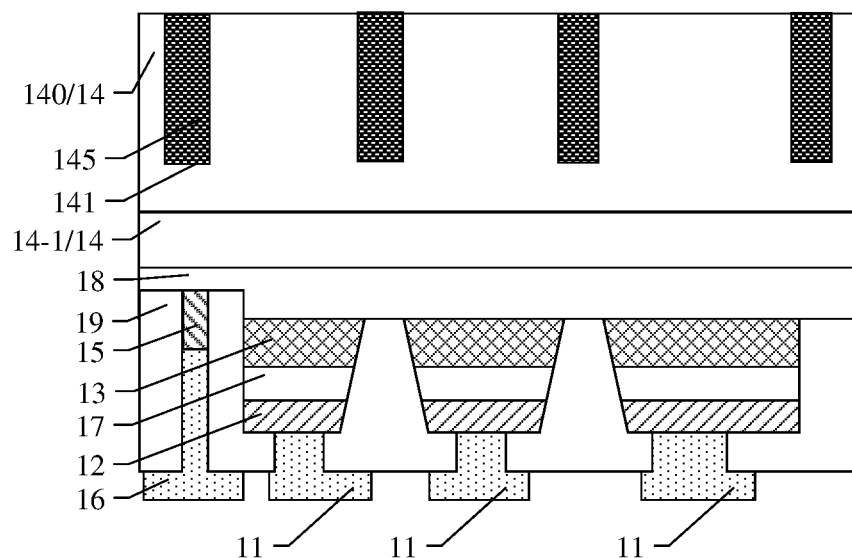
FIG. 23 is a schematic structural diagram of forming a groove in a sapphire layer of a light emitting diode chip and forming a light shielding material in the groove.

For example, FIG. 23 is a schematic structural diagram of forming a groove in a sapphire layer of a light emitting diode chip and forming a light shielding material in the groove. As shown in FIG. 23, after the first contact pad 16 and the second contact pad 11 are formed in the light emitting diode chip, the sapphire layer 140 is processed, and for example, the sapphire layer 140 is polished to have a thickness of 60 microns. For example, after the sapphire layer 140 is polished, a plurality of grooves 141 are formed at a side of the base 14 away from the light emitting layer 13, e.g., at a side of the sapphire layer 140 away from the light emitting layer 13. For example, after the groove 141 is formed, a light shielding material 145 can be formed in the groove 141.

For example, as shown in FIG. 21, after the light shielding material 145 is formed, a pixel defining portion 150 having a plurality of openings 151 can be formed by patterning at a side of the light shielding material 145 away from the light emitting layer 13. For example, the first color conversion layer 210 and the second color conversion layer 310 are respectively formed in the opening 151 of the second color light emitting unit 200 and the opening 151 of the third color light emitting unit 300. For example, color conversion materials are formed in the openings 151 by printing. For example, the color conversion materials can include quantum dot materials or fluorescent materials. For example, scattering particles 110 can be formed in the opening 151 of the first color light emitting unit 100. For example, a transparent material including the scattering particles 110, such as photoresist, can be formed in the opening 151 of the first color light emitting unit 100.

For example, as shown in FIG. 21, after the color conversion layer is formed, a color filter layer 30 is formed at a side of the color conversion layer away from the base 14.

Another embodiment of the present disclosure provides a display device, which includes any of the display substrates described above.

In the display device provided by the present disclosure, on the one hand, by dividing each light emitting diode chip to make the same light emitting diode chip emit light of at least two different colors, the high pixels per inch requirement of the display panel can be realized; on the other hand, the plurality of light emitting units included in each light emitting diode chip share one first electrode, so that the effective light emitting area of each light emitting unit can be increased as much as possible.

In the display device provided by the present disclosure, the plurality of light emitting units in the light emitting diode chip are distributed in a triangle, and the pitch of the light emitting diode chips can be set smaller while the cross color scale of light emitting units of different colors is greatly reduced.

In the display device provided by the present disclosure, a plurality of light emitting units emitting light of different colors are arranged in the same light emitting diode chip, and the positions of the light emitting regions of the plurality of light emitting units and the positions of the contact pads of the plurality of light emitting units are set, which can not only reduce the cross color scale between adjacent light emitting units, but also increase pixels per inch of the display substrate. In addition, by controlling the light emitting layers of different light emitting units to emit first color light with the same intensity, it can also be ensured that the service life of materials in different color conversion layers is approximately the same. In this case, white balance is realized by adjusting the areas of light emitting regions of different color light emitting units (aperture ratio).

In the display device provided by the present disclosure, a groove is provided at a side of the base away from the light emitting layer, a light shielding layer is provided at the inner side wall of the groove, and the color conversion layer is disposed in the groove, so that the distance between the light emitting layer and the color conversion layer can be reduced, thereby reducing the distance between the light emitting regions of adjacent light emitting units and being beneficial to reducing the size of the light emitting diode chip and further increasing the pixels per inch of the display device.

The display device provided by the present disclosure can be a mini LED display device with anti-crosstalk and high-resolution characteristics.

For example, the display device provided by the embodiment of the present disclosure can further include an array substrate that provides electrical signals for the light emitting diode chips, and specifically, the array substrate can include driving circuits and bonding electrodes. The bonding electrodes are configured to be connected with the first electrodes and the second electrodes of the light emitting diode chips in one-to-one correspondence. Specifically, the bonding electrodes can be directly connected with the first electrodes and the second electrodes of the light emitting diode chips through connection materials (such as metal or alloy material with low melting point, or anisotropic conductive adhesive), and the bonding electrodes can also be connected with the first contact pads and the second contact pads of the light emitting diode chips through connection materials (such as metal or alloy material with low melting point, or anisotropic conductive adhesive). Each light emitting unit can be controlled by a separate driving circuit, and the driving circuit can have a 2T1C structure, that is, a structure consisting of a light emitting control transistor, a driving transistor and a storage capacitor. The present embodiment includes but is not limited thereto. For example, the driving circuit can also have a structure of 5T1C, 6T1C, 7T1C or 8T2C, etc.

The following statements should be noted:
(1) The accompanying drawings related to the embodiment(s) of the present disclosure involve only the structure(s) in connection with the embodiment(s) of the present disclosure, and other structure(s) can be referred to common design(s).
(2) In case of no conflict, features in one embodiment or in different embodiments can be combined.

What have been described above are only specific implementations of the present disclosure, and the protection scope of the present disclosure is not limited thereto. Therefore, the protection scope of the present disclosure should be determined based on the protection scope of the claims.

What is claimed is:
1. A display substrate, comprising:
a plurality of light emitting diode chips, wherein each of the plurality of light emitting diode chips comprises a plurality of light emitting units which respectively emit light of different colors, each of the plurality of light emitting units comprises a first electrode, a light emitting layer, a base and a second electrode, wherein the base is located at a side of the light emitting layer away from the second electrode,
wherein, in each of the plurality of light emitting diode chips, the plurality of light emitting units share the base and the first electrode, the light emitting layers of the plurality of light emitting units emit light of a same color, the light of a same color is a first color light, and at least one light emitting unit further comprises a first color conversion layer located at a side of the base away from the light emitting layer, so as to convert the first color light emitted by the light emitting layer into a second color light;

each of the plurality of light emitting units further comprises a first contact pad and a second contact pad which are arranged in a same layer, the first contact pad is connected with the first electrode, and the second contact pad is connected with the second electrode;

each of the plurality of light emitting diode chips comprises a first color light emitting unit, a second color light emitting unit and a third color light emitting unit, the first color light emitting unit is configured to emit the first color light; the second color light emitting unit further comprises the first color conversion layer located at a side of the base away from the light emitting layer and the second color light emitting unit emits the second color light, and the third color light emitting unit further comprises a second color conversion layer at a side of the base away from the light emitting layer, so as to convert the first color light emitted by the light emitting layer into third color light.

2. The display substrate according to claim 1, wherein, in each of the plurality of light emitting diode chips, connection lines between geometric centers of a light emitting region of the first color light emitting unit, a light emitting region of the second color light emitting unit and a light emitting region of the third color light emitting unit form a first triangle, and a ratio of shortest distances between edges of the light emitting regions of different color light emitting units is in a range of 0.6 to 1.5.

3. The display substrate according to claim 2, wherein the light emitting regions of the plurality of light emitting units in each of the plurality of light emitting diode chips are distributed in a rectangular region, and the light emitting region of the first color light emitting unit, the light emitting region of the second color light emitting unit and the light emitting region of the third color light emitting unit are located at three right angles of the rectangular region, respectively.

4. The display substrate according to claim 3, wherein, in each of the plurality of light emitting diode chips, the second contact pad of the first color light emitting unit, the second contact pad of the second color light emitting unit and the second contact pad of the third color light emitting unit are respectively distributed at the three right angles of the rectangular region, and the first contact pad is located at a fourth right angle of the rectangular region.

5. The display substrate according to claim 2, wherein the first triangle is an acute triangle.

6. The display substrate according to claim 5, wherein, in each of the plurality of light emitting diode chips, connection lines between geometric centers of the second contact pad of the first color light emitting unit, the second contact pad of the second color light emitting unit and the second contact pad of the third color light emitting unit form a second triangle, and at least part of the first contact pad is located in the second triangle.

7. The display substrate according to claim 1, wherein an area of the light emitting region of the second color light emitting unit and an area of the light emitting region of the third color light emitting unit are both greater than an area of the light emitting region of the first color light emitting unit.

8. The display substrate according to claim 2, wherein the plurality of light emitting diode chips are arranged in an array along a first direction and a second direction, and a pitch of the plurality of light emitting diode chips along at least one of the first direction and the second direction is not greater than 400 microns.

9. The display substrate according to claim 1, wherein a side of the base away from the light emitting layer is provided with a plurality of grooves.

10. The display substrate according to claim 9, wherein a depth of at least one of the plurality of grooves is greater than 10 microns.

11. The display substrate according to claim 9, wherein each of the plurality of light emitting units is provided with one groove, and in each of the plurality of light emitting units, the groove overlaps with the light emitting layer, and a light-shielding layer is provided at an inner side wall of at least one groove;

the first color conversion layer is disposed in the groove of the second color light emitting unit, and the second color conversion layer is disposed in the groove of the third color light emitting unit.

12. The display substrate according to claim 11, wherein a transparent filling layer is disposed in a bottom of the groove of at least one of the second color light emitting unit and the third color light emitting unit.

13. The display substrate according to claim 11, wherein a blocking portion is provided at a side, away from the light emitting layer, of a gap between the grooves of adjacent light emitting units, and a material of the blocking portion comprises a hydrophobic material.

14. The display substrate according to claim 9, wherein at least part of the plurality of grooves are arranged between adjacent light emitting units, and at least an inner side wall of each of the plurality of grooves is provided with a light shielding material.

15. The display substrate according to claim 14, wherein a pixel defining portion is provided at a side of the base away from the light emitting layer, the pixel defining portion comprises a plurality of openings to define a plurality of light emitting regions of the plurality of light emitting units, the first color conversion layer is disposed in the opening of the second color light emitting unit, and the second color conversion layer is disposed in the opening of the third color light emitting unit.

16. The display substrate according to claim 15, wherein at least one groove is fully filled with the light shielding material, and at least part of the pixel defining portion is stacked with the light shielding material.

17. The display substrate according to claim 9, wherein, in each of the plurality of light emitting diode chips, light emitting regions of the plurality of light emitting units are arranged along a third direction, the second contact pad is located at a side of the light emitting regions of the plurality of light emitting units in a fourth direction, and the third direction is intersected with the fourth direction.

18. The display substrate according to claim 9, wherein, in each of the plurality of light emitting diode chips, a shortest distance between edges of the light emitting regions of adjacent light emitting units is not greater than 50 microns.

19. A display device, comprising the display substrate according to claim 1.

* * * * *